(12) United States Patent
Machida et al.

(10) Patent No.: US 9,419,234 B2
(45) Date of Patent: *Aug. 16, 2016

(54) ELECTRODE BODY FOR SOLAR CELL, METHOD FOR PRODUCING THE ELECTRODE BODY, AND SOLAR CELL PROVIDED WITH THE ELECTRODE BODY

(75) Inventors: Kenji Machida, Tokyo (JP); Sekihiro Takeda, Tokyo (JP); Ryo Muroi, Tokyo (JP); Nozomu Kamiyama, Tokyo (JP); Masashi Ozawa, Tokyo (JP)

(73) Assignee: NIPPON CHEMI-CON CORPORATION, Tokyo (JP)

(*) Notice: Subject to any disclaimer, the term of this patent is extended or adjusted under 35 U.S.C. 154(b) by 234 days.

This patent is subject to a terminal disclaimer.

(21) Appl. No.: 14/007,942

(22) PCT Filed: Mar. 31, 2012

(86) PCT No.: PCT/JP2012/058761
§ 371 (c)(1),
(2), (4) Date: Sep. 26, 2013

(87) PCT Pub. No.: WO2012/133858
PCT Pub. Date: Oct. 4, 2012

(65) Prior Publication Data
US 2014/0014167 A1    Jan. 16, 2014

(30) Foreign Application Priority Data

Mar. 31, 2011 (JP) .................................. 2011-080677
Jan. 26, 2012 (JP) .................................. 2012-014659

(51) Int. Cl.
*H01G 9/20* (2006.01)
*H01L 51/44* (2006.01)
(Continued)

(52) U.S. Cl.
CPC ............... *H01L 51/442* (2013.01); *C08K 5/43* (2013.01); *H01G 9/20* (2013.01); *H01G 9/2022* (2013.01);
(Continued)

(58) Field of Classification Search
CPC .. H01L 31/02; H01L 31/0224; H01L 31/0216

USPC .......................................... 136/252, 256, 263
See application file for complete search history.

(56) References Cited

U.S. PATENT DOCUMENTS

2013/0037411 A1    2/2013 Atobe et al.

FOREIGN PATENT DOCUMENTS

JP          3-50813 A      3/1991
JP       2000-269087 A     9/2000
(Continued)

OTHER PUBLICATIONS

Asami et al., "Electropolymerization of an Immiscible Monomer in Aqueous Electrolytes Using Acoustic Emulsification", J. Am. Chem. Soc., 2005, vol. 127, No. 38, pp. 13160-13161.
Imoto et al., "Activated Carbon Counter Electrode for Dye-sensitized Solar Cell", Electrochemistry, 2003, vol. 71, No. 11, pp. 944-946.
(Continued)

*Primary Examiner* — Susan D Leong
(74) *Attorney, Agent, or Firm* — Birch, Stewart, Kolasch & Birch, LLP

(57) ABSTRACT

Disclosed is an electrode body for a solar cell, which is capable of being used as a component of both an organic thin-film solar cell and a dye-sensitized solar cell, and has excellent heat resistance. This electrode body for a solar cell is provided with a substrate with a conductive part at least on the surface and a conductive polymer layer located on the conductive part of the substrate, in which the conductive polymer layer includes: a polymer derived from at least one monomer selected from the group consisting of 3,4-disubstituted thiophenes; and an anion as a dopant to the polymer generated from at least one organic non-sulfonate compound having an anion with the molecular weight of 200 or more. Additionally, the density of the conductive polymer layer is in the range of 1.15 to 1.80 g/cm³. The dense conductive polymer layer including the anion as a dopant exhibits excellent heat resistance.

20 Claims, 13 Drawing Sheets

(51) Int. Cl.
  *H01L 31/0224* (2006.01)
  *C08K 5/43* (2006.01)
  *H01L 51/00* (2006.01)
  *C08G 61/12* (2006.01)
  *H01M 14/00* (2006.01)

(52) U.S. Cl.
  CPC .... *H01L 31/022425* (2013.01); *H01L 51/0006* (2013.01); *H01L 51/0021* (2013.01); *C08G 61/126* (2013.01); *H01G 9/2031* (2013.01); *H01G 9/2059* (2013.01); *H01L 51/0037* (2013.01); *H01L 51/0086* (2013.01); *H01L 51/441* (2013.01); *H01M 14/005* (2013.01); *Y02E 10/542* (2013.01); *Y02E 10/549* (2013.01); *Y02P 70/521* (2015.11)

(56) References Cited

FOREIGN PATENT DOCUMENTS

| | | |
|---|---|---|
| JP | 2006-351289 A | 12/2006 |
| JP | 2007-119631 A | 5/2007 |
| JP | 2007-128757 A | 5/2007 |
| WO | WO 2011/108254 A1 | 9/2011 |

OTHER PUBLICATIONS

International Search Report, dated Jul. 3, 2012, for International Application No. PCT/JP2012/058761.

Xi et al., "The characteristics of the small molecule organic solar cells with PEDOT:PSS/LiF double anode buffer layer system", Solar Energy Materials & Solar Cells, 2010, vol. 94, pp. 623-628.

European Patent Communication and Extended Search Report issued in the corresponding European Patent Application No. 12764049.8 on Aug. 6, 2014.

(A)　　　　　　　　　(B)

(A)　　　　　　　　　(B)

(A)

(B)

(A)

(B)

(A)

(B)

(A)

(B)

(A)                (B)

(A)                (B)

ELECTRODE BODY FOR SOLAR CELL, METHOD FOR PRODUCING THE ELECTRODE BODY, AND SOLAR CELL PROVIDED WITH THE ELECTRODE BODY

BACKGROUND OF THE INVENTION

1. Field of the Invention

The present invention relates to an electrode body for a solar cell with excellent heat resistance that can be used as a component of both an organic thin-film solar cell and a dye-sensitized solar cell, and a production method thereof. The present invention also relates to a solar cell with the electrode body.

2. Description of the Related Art

Organic solar cells, which can be roughly categorized into two types, organic thin-film solar cells and dye-sensitized solar cells, have the following advantages compared with silicon solar cells. The organic solar cells have no resource constraint, the production cost thereof can be curbed because of inexpensive raw materials and simple production processes, and they can be made lightweight and flexible.

An organic thin-film solar cell has a structure in which a photoelectric conversion layer with a hole transporter (p-type semiconductor) and an electron transporter (n-type semiconductor) is wedged between a positive electrode and a negative electrode. Generally, a transparent electrode, in which a vapor-deposited layer of semiconductive ceramics such as tin-doped indium oxide (ITO) and fluorine-doped tin oxide (FTO) is formed on the surface of a transparent substrate such as glass, is used as the positive electrode, and a metal electrode such as aluminum film and magnesium-silver alloy film, which has a smaller work function than ITO and FTO, is used as the negative electrode. When light is irradiated on the photoelectric conversion layer through the transparent electrode, an electron and a hole are formed in the photoelectric conversion layer, and the hole is transported to the positive electrode through the hole transporter, and the electron is transported to the negative electrode through the electron transporter, respectively, in isolation.

The performance of an organic thin-film solar cell is affected not only by the photoelectric conversion layer but the surface boundary between the positive electrode and the photoelectric conversion layer. Due to the poor smoothness and adhesiveness between the positive electrode and the photoelectric conversion layer, the transport efficiency of a hole from the photoelectric conversion layer to the positive electrode is decreased, which lowers the short-circuit current density of a solar cell and decreases the photoelectric conversion efficiency. To prevent this, a hole extraction layer composed of a conductive polymer layer with hole transportation capability is placed between the positive electrode and the photoelectric conversion layer. This hole extraction layer mainly has the function of smoothing the surface of the positive electrode and decreasing the interface resistance between the photoelectric conversion layer and the positive electrode.

As the hole extraction layer, a layer of polythiophene, especially a polystyrene sulfonate of poly(3,4-ethylenedioxythiophene) has been frequently used (hereinafter 3,4-ethylenedioxythiophene is referred to as "EDOT", poly(3,4-ethylenedioxythiophene) as "PEDOT", polystyrene sulfonic acid as "PSS", and a polystyrene sulfonate of poly(3,4-ethylenedioxythiophene) as "PEDOT:PSS"). For example, Non-patent Document 1 (Solar Energy Materials & Solar Cells 94 (2010) 623-628) discloses an organic thin-film solar cell that is produced by forming a hole extraction layer by spin-coating an aqueous PEDOT:PSS dispersion on a positive electrode having an ITO layer on a glass substrate, and then forming a hole transporter layer consisting of copper-phthalocyanine, an electron transporter layer consisting of fullerene, a hole block layer consisting of a thin film of lithium fluoride, and a negative electrode consisting of an aluminum film by a vacuum deposition method in this order. This Document reports that asperity of the surface of the ITO electrode was remarkably improved by the PEDOT:PSS hole extraction layer, the transport efficiency of a hole from the photoelectric conversion layer to the positive electrode was remarkably improved, and as a result the short-circuit current density of the solar cell was greatly increased.

A dye-sensitized solar cell has a structure in which an electrolyte layer containing paired oxidized species and reduced species is wedged between a negative electrode with a semiconductor layer containing a pigment as a photosensitizer and a positive electrode with a catalyst layer to convert the oxidized species in the electrolyte layer to the reduced species. Generally, an electrode in which an oxide semiconductor layer supporting a pigment such as ruthenium complex is formed on the above-mentioned transparent electrode is used as a negative electrode and an electrode in which Pt is bonded on a substrate such as the above-mentioned transparent electrode or steel by a sputtering method or a vacuum deposition method is used as a positive electrode. When light is irradiated on the pigment of the semiconductor layer through the transparent electrode, the pigment absorbs light energy and becomes excited, and emits an electron toward the semiconductor. The emitted electron moves from the semiconductor layer to the transparent electrode, and further moves from the transparent electrode to the positive electrode via an external circuit. Then, by the action of the Pt catalyst layer of the positive electrode, the oxidized species (for example, $I_3^-$) in the electrolyte layer receives an electron from the positive electrode and is converted to the reduced species (for example, $I^-$), and further, the reduced species (for example, $I^-$) emits the electron toward the pigment and is converted to the oxidized species (for example, $I_3^-$).

The Pt catalyst layer of the positive electrode has a problem in that, though it has excellent catalytic activity to convert an oxidized species of an electrolyte layer into a reduced species, it is expensive and does not have enough durability against $I^-$ ions when water exists. Therefore, a conductive material as a substitute of the Pt catalyst layer has been hitherto considered, and a polythiophene layer, especially a PEDOT:PSS layer has been considered. For example, Non-patent Document 2 (Electrochemistry 71, No. 11 (2003) 944-946) reports the results of selecting an electrode with three types of conductive polymer layer, a PEDOT:PSS electrode, a polyaniline electrode and a polypyrrole electrode, evaluating a cyclic voltammogram in an electrolyte containing an $I^-/I_3^-$ redox pair and making a comparison with that of a Pt electrode. While the cyclic voltammogram of the Pt electrode clearly shows a reduction wave from $I_3^-$ to $I^-$, the cyclic voltammograms of the PEDOT:PSS electrode and the polypyrrole electrode hardly show a reduction wave from $I_3^-$ to $I^-$, and the cyclic voltammogram of the polyaniline electrode does not show an oxidation-reduction wave at all.

PRIOR ARTS DOCUMENTS

Non-Patent Documents

Non-patent Document 1: Solar Energy Materials & Solar Cells 94 (2010) 623-628

Non-patent Document 2: Electrochemistry 71, No. 11 (2003) 944-946

BRIEF SUMMARY OF THE INVENTION

1. Problems to be Solved by the Invention

As mentioned above, a PEDOT:PSS layer is a conductive polymer layer which is also considered as a hole extraction layer of an organic thin-film solar cell or a catalyst layer in a positive electrode of a dye-sensitized solar cell. However, the PEDOT:PSS layer has a problem that it exhibits high water absorption.

In this regard, Non-patent Document 1 reports that the characteristics of an organic thin-film solar cell with a PEDOT:PSS hole extraction layer rapidly deteriorate when the solar cell is left without light irradiation in an atmosphere in which temperature is 25 degrees centigrade and humidity is 55% because the PEDOT:PSS layer absorbs vapor from the atmosphere and this leads to increased sheet resistance. Further, as PSS is a diffusion-prone material, there is a concern that it diffuses and reacts with other components of a solar cell. Moreover, since an aqueous PEDOT:PSS dispersion for composing a hole extraction layer is an acid material having a pH of less than 3, it may decompose other components of the solar cell.

Also, catalytic activity to reduce the oxidized species of the electrolyte layer is especially required for the positive electrode of a dye-sensitized solar cell, but as is shown in Non-patent Document 2, the $I_3^-$ reduction reaction does not easily occur even in a PEDOT:PSS electrode, nor needless to say, in a polyaniline electrode or a polypyrrole electrode, and then sufficient reproduction of $I^-$ is difficult; therefore, it does not have a satisfactory performance as a positive electrode of a dye-sensitized solar cell.

Moreover, as each component of a solar cell may experience high temperature in the manufacturing process of the solar cell, and the outdoor use of the solar cell in extremely hot weather is envisaged, enough heat resistance is required for each component of the solar cell. However, a PEDOT:PSS layer hitherto considered as a hole extraction layer of an organic thin-film solar cell or a catalyst layer of a positive electrode of a dye-sensitized solar cell does not have satisfactory heat resistance.

Therefore, the objective of the present invention is to provide an electrode body for a solar cell that can be used as a component of both an organic thin-film solar cell and a dye-sensitized solar cell and also has excellent heat resistance, and a production method thereof.

2. Means for Solving Problems

It has been found after keen examination that the above-mentioned objective is achieved by selecting an anion generated from an organic non-sulfonate compound having an anion with the molecular weight of 200 or more, as a dopant to a conductive polymer derived from a 3,4-disubstituted thiophene (hereinafter referred to as "substituted thiophene") and densely forming the conductive polymer layer. The "organic non-sulfonate compound" means an organic compound that does not have a sulfonic acid group and/or a sulfonic acid salt group.

Therefore, the present invention, in the first place, relates to an electrode body for a solar cell comprising a substrate with a conductive part at least on the surface and a conductive polymer layer located on the conductive part of the substrate, in which the conductive polymer layer comprises: a polymer derived from at least one monomer selected from the group consisting of the disubstituted thiophenes; and an anion as a dopant to the polymer generated from at least one organic non-sulfonate compound having an anion with the molecular weight of 200 or more, and the density of the conductive polymer layer is within the range of 1.15 to 1.80 $g/cm^3$.

The conductive polymer layer in the electrode body for a solar cell of the present invention has excellent hole transportation capability and also has excellent catalytic activity to convert an oxidized species into a reduced species in a redox pair. Also, this conductive polymer layer is stable against moisture in the atmosphere and has excellent heat resistance.

The conductive polymer layer comprises, as a dopant, an anion generated from an organic non-sulfonate compound having an anion with the molecular weight of 200 or more. An anion generated from an inorganic compound, or even in the case of an organic compound, an anion generated from a compound with a sulfonic acid group and/or a sulfonic acid salt group, or, even in an organic compound without a sulfonic acid group and/or a sulfonic acid salt group, an anion produced from a compound in which the molecular weight of the anion is less than 200 does not produce a conductive polymer layer with an excellent heat resistance. Further, if the density of the conductive polymer layer is less than 1.15 $g/cm^3$, heat resistance rapidly decreases, while manufacture of a conductive polymer layer in which the density is more than 1.80 $g/cm^3$ is difficult. The density of the conductive polymer layer with excellent heat resistance is preferably within the range of 1.20 to 1.80 $g/cm^3$, and particularly within the range of 1.60 to 1.80 $g/cm^3$. In case of obtaining an electrode body for a solar cell with flexibility, since the conductive polymer layer becomes hardened and has little flexibility if the density of the conductive polymer is too high, the density of the conductive polymer layer is preferably 1.75 $g/cm^3$ or less, and particularly 1.70 $g/cm^3$ or less. The thickness of the conductive polymer layer is generally within the range of 1 to 2000 nm, preferably 35 to 350 nm, and particularly 70 to 350 nm. If the thickness is less than 1 nm, the smoothing effect of the asperity of a conductive part in a substrate, which is crucial when it is used as a component of an organic thin-film solar cell, becomes difficult to be obtained, and catalytic activity to convert an oxidized species in the electrolyte layer to a reduced species, which is crucial when it is used as a component of a dye-sensitized solar cell, becomes insufficient. A thickness of more than 2000 nm is not preferable because the internal resistance of the conductive polymer layer becomes large.

Especially, it is preferable that the organic non-sulfonate compound is selected from the group consisting of borodisalicylic acid, borodisalicylic salts, a sulfonylimidic acid of the formula (I) or the formula (II)

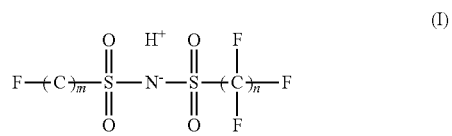

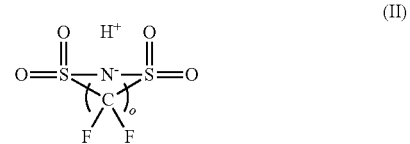

where m is an integer from 1 to 8, preferably an integer from 1 to 4, especially preferably 2, n is an integer from 1 to 8, preferably an integer from 1 to 4, especially preferably 2, and o is 2 or 3, and salts thereof. The anions of these organic non-sulfonate compounds produce a conductive polymer layer with outstanding heat resistance. Among all compounds, a salt of bis(pentafluoroethanesulfonyl)imide acid is particularly preferable.

In the electrode body for a solar cell of the present invention, the monomer constituting the conductive polymer can be of any compound without limitation as long as it is selected from the group consisting of the substituted thiophenes, that is, 3,4-disubstituted thiophenes. Substituents at the 3- and 4-positions of the thiophene ring can form a ring with carbons at the 3- and 4-positions. Especially, it is preferable if the monomer is EDOT, because a conductive polymer layer with excellent environmental stability and optical permeability (transparency) is obtained, and because an electrode body of a solar cell with excellent optical permeability (transparency) is obtained by using a transparent substrate as a substrate. The transparent substrate can be obtained by placing a transparent semiconductive ceramic layer such as an ITO layer, a tin oxide layer or a FTO layer on the surface of a transparent and insulating glass substrate or plastic substrate by vapor deposition or coating.

The electrode body for a solar cell of the present invention can be manufactured by a method comprising: a preparation process of obtaining a polymerization solution comprising: a solvent consisting of 100 to 80% by mass of water and 0 to 20% by mass of an organic solvent; at least one monomer selected from the group consisting of the substituted thiophenes; and at least one organic non-sulfonate compound having an anion with the molecular weight of 200 or more; and a polymerization process of introducing a substrate with a conductive part at least on the surface to the polymerization solution and performing electrolytic polymerization to form a conductive polymer layer by polymerization of the monomer on the conductive part of the substrate. The organic non-sulfonate compound within the specific range mentioned above is also referred to as an "organic non-sulfonate supporting electrolyte" because it acts as a supporting electrolyte in the polymerization solution. Moreover, the solvent consisting of 100 to 80% by mass of water and 0 to 20% by mass of an organic solvent is hereinafter referred to as a "water-rich solvent". In the water-rich solvent, the total amount of water and an organic solvent is 100% by mass.

Since a conductive polymer layer is formed on the conductive part of the substrate with excellent adhesion by electrolytic polymerization, the interface resistance between the conductive part and the conductive polymer layer is small. Also, the conductive polymer layer obtained from electrolytic polymerization has excellent hole transportation capability, excellent catalytic activity to convert an oxidized species to a reduced species in a redox pair, and excellent heat resistance. Moreover, the conductive polymer layer obtained from electrolytic polymerization is air-moisture stable and in no danger of decomposing other components of the solar cell. If the contained amount of an organic solvent is more than 20% by mass of the whole solvent, the density of the conductive polymer layer rapidly decreases, and heat resistance of the conductive polymer layer is also decreased. The contained amount of water in the water-rich solvent is preferably 90% by mass or more, more preferably 95% or more, and particularly preferably 100% by mass.

Of the above-mentioned specific range of organic non-sulfonate compounds, a borodisalicylate ion contained in borodisalicylic acid and its salts is known to hydrolyze into salicylic acid and boric acid in water, which have extremely low solubility in water. Therefore, if borodisalicylic acid and/ or its salt are used as a supporting electrolyte, precipitation is gradually produced in a polymerization solution and the solution becomes no longer usable. To avoid this, if borodisalicylic acid and/or its salt are used as a supporting electrolyte, electrolytic polymerization is carried out after addition of this supporting electrolyte to the solution and before precipitate formation, or, the supporting electrolyte is used concurrently with a stabilizer selected from the group consisting of nitrobenzene and nitrobenzene derivatives, which has the function of inhibiting hydrolysis of borodisalicylate ions. A compound selected from the group consisting of o-nitrophenol, m-nitrophenol and p-nitrophenol, which are highly soluble in water, is preferably used as the stabilizer.

In the polymerization solution for electrolytic polymerization that is obtained in the preparation process, it is acceptable that the monomer at a saturated solubility or less is contained in the polymerization solution and the total quantity of the monomer is dissolved in the polymerization solution, but it is also acceptable that the monomer at a quantity more than saturated solubility are contained in the polymerization solution and the monomer that cannot be dissolved is dispersed in the polymerization solution as oil drops. By irradiating an ultrasonic wave into a solution containing a monomer at a quantity more than saturated solubility, the monomer can be highly dispersed as oil drops in the polymerization solution, and a stable polymerization solution with inhibited demulsification can be obtained. The monomer dissolved in the polymerization solution solely engage in electrolytic polymerization, but electrolytic polymerization rapidly progresses because the monomer in an amount equivalent to the consumption due to polymerization is replenished by oil drops adjacent to the electrode and dissolved into the solution. The "ultrasonic wave" refers to a sonic wave with a frequency of 10 kHz or more.

The method itself to make use of irradiation of ultrasonic waves in the preparation of a polymerization solution for electrolytic polymerization is heretofore known. J. AM. CHEM. SOC. (2005), 127(38), 13160-13161 reports the result of adding an amount of EDOT more than the saturated solution amount to an aqueous solution in which $LiClO_4$ as a supporting electrolyte is dissolved, irradiating an ultrasonic wave at a frequency of 20 kHz and with an output of 22.6 $W/cm^2$ for 60 seconds, obtaining an opaque polymerization solution in which monomer oil drops are dispersed in water (see FIG. 1 of this document), and forming an electropolymerized layer on a Pt electrode using this polymerization solution. However, this document does not include a statement to suggest the supporting electrolyte to be used in the present invention, or a statement to suggest that an electrode body for a solar cell with excellent heat resistance is obtained by using this supporting electrolyte.

The electrode body for a solar cell of the present invention can be suitably used as a component of an organic thin-film solar cell because the conductive polymer layer formed on the substrate has excellent hole transportation capability. Therefore, the present invention also relates to an organic thin-film solar cell comprising: a positive electrode with a conductive part at least on the surface; a hole extraction layer located on the conductive part of the positive electrode; a photoelectric conversion layer located on the hole extraction layer having a hole transporter and an electron transporter; and a negative electrode located on the photoelectric conversion layer, in which the positive electrode and the hole extraction layer are composed of the electrode body for a solar cell of the present invention.

The electrode body for a solar cell of the present invention is also suitably used as a component for a dye-sensitized solar cell because the conductive polymer layer formed on the substrate has excellent reduction catalytic activity. Therefore, the present invention also relates to a dye-sensitized solar cell comprising: a negative electrode having a semiconductor layer with a pigment as a photosensitizer; an electrolyte layer located on the semiconductor layer of the negative electrode having paired oxidized species and reduced species; and a positive electrode located on the electrolyte layer having a conductive polymer layer that acts as a catalyst to convert the oxidized species into the reduced species, in which the positive electrode is composed of the electrode body for a solar cell of the present invention.

3. Advantageous Effects of the Invention

The conductive polymer layer formed on the substrate in the electrode body for a solar cell of the present invention has excellent hole transportation capability, excellent catalytic activity to convert an oxidized species to a reduced species in a redox pair, and excellent heat resistance. Therefore, the electrode body for the solar cell of the present invention can be suitably used as a component for both an organic thin-film solar cell and a dye-sensitized solar cell.

DETAILED DESCRIPTION OF THE INVENTION

Figure 1:
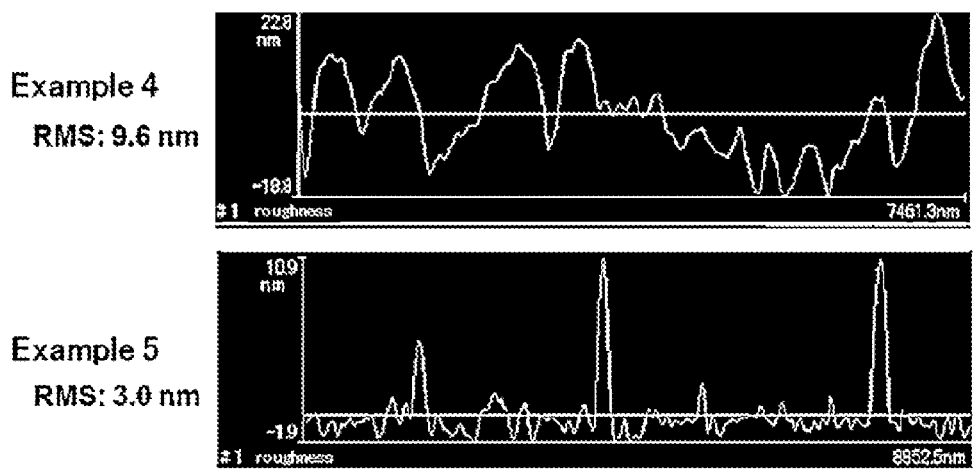
In FIG. 1, the surface roughness of a conductive polymer layer in an electrode body obtained from a polymerization solution containing ammonium borodisalicylate, p-nitrophenol, and EDOT at the saturated solubility or less is compared with the surface roughness of a conductive polymer layer in an electrode body obtained from a polymerization solution containing sodium bis(pentafluoroethanesulfonyl)imide and EDOT at the saturated solubility or less.
Figure 2:
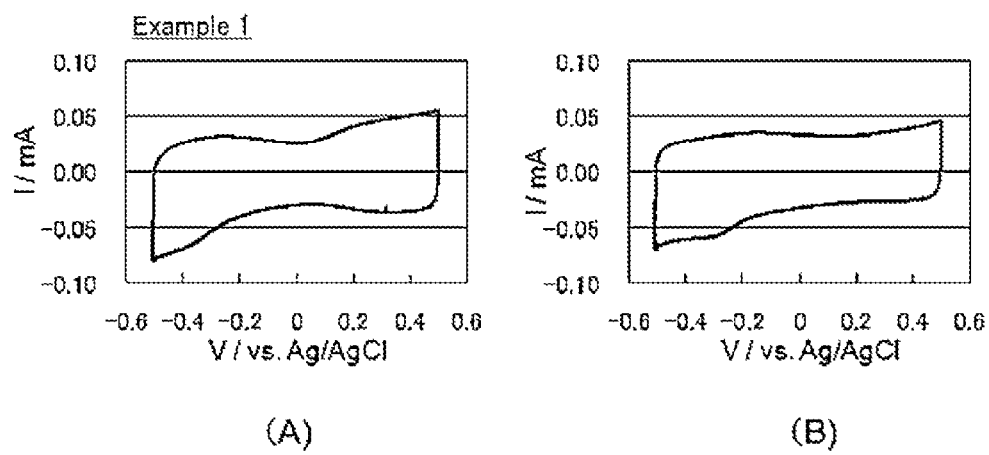
FIG. 2 shows a cyclic voltammogram in an aqueous sodium sulfate solution of an electrode body obtained from a polymerization solution containing sodium bis(pentafluoroethanesulfonyl)imide and EDOT at the saturated solution amount or less; (A) shows the measurement result of the early stage and (B) shows the measurement result after a high temperature is experienced.
Figure 3:
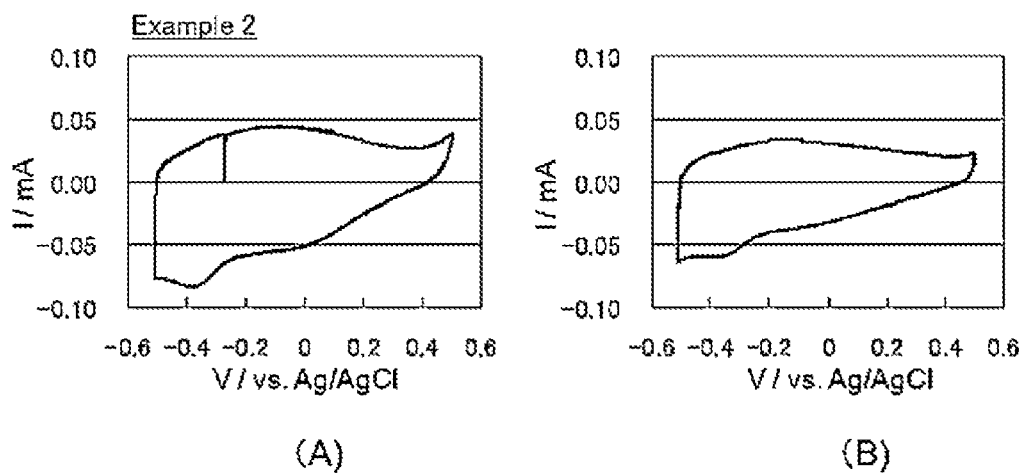
FIG. 3 shows a cyclic voltammogram in an aqueous sodium sulfate solution of an electrode body obtained from a polymerization solution containing ammonium borodisalicylate and EDOT at the saturated solution amount or less; (A) shows the measurement result of the early stage and (B) shows the measurement result after a high temperature is experienced.
Figure 4:
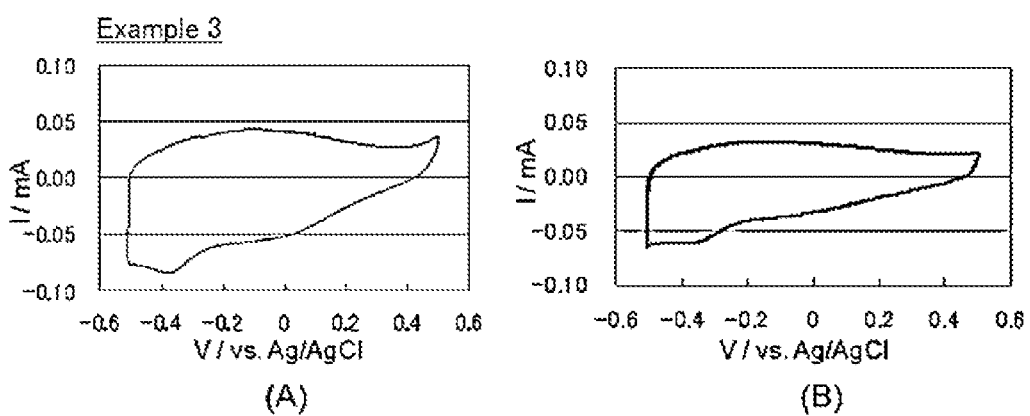
FIG. 4 shows a cyclic voltammogram in an aqueous sodium sulfate solution of an electrode body obtained from a polymerization solution containing ammonium borodisalicylate and EDOT at more than the saturated solution amount; (A) shows the measurement result of the early stage and (B) shows the measurement result after a high temperature is experienced.
Figure 5:
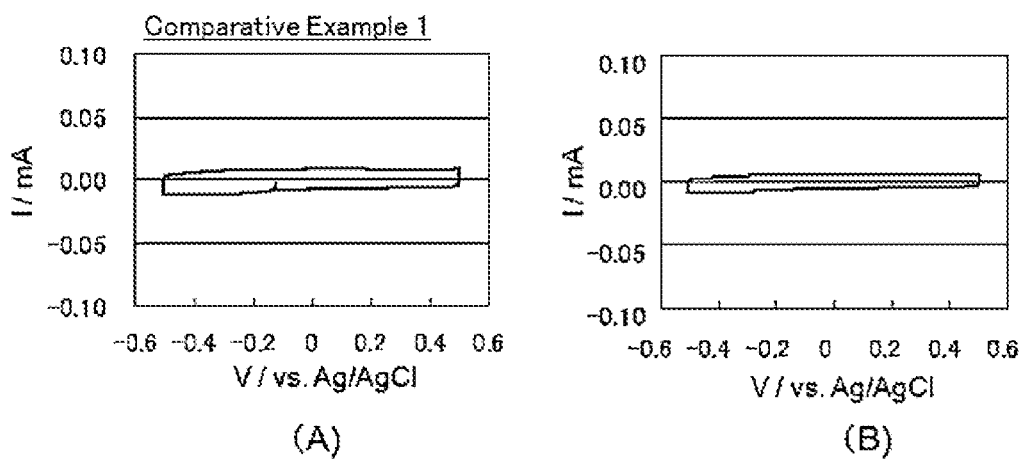
FIG. 5 shows a cyclic voltammogram in an aqueous sodium sulfate solution of an electrode obtained from a slurry containing PEDOT:PSS; (A) shows the measurement result of the early stage and (B) shows the measurement result after a high temperature is experienced.
Figure 6:
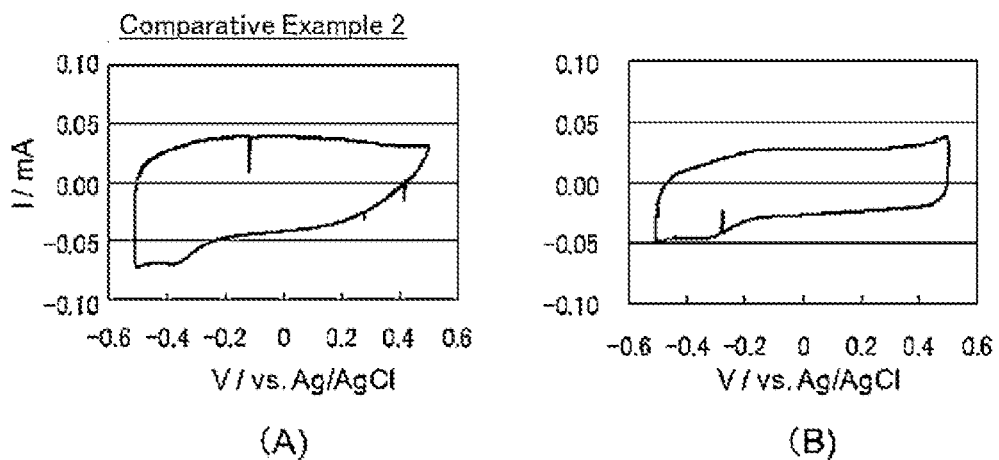
FIG. 6 shows a cyclic voltammogram in an aqueous sodium sulfate solution of an electrode obtained from a polymerization solution containing sodium butylnaphthalene sulfonate and EDOT; (A) shows the measurement result of the early stage and (B) shows the measurement result after a high temperature is experienced.
Figure 7:
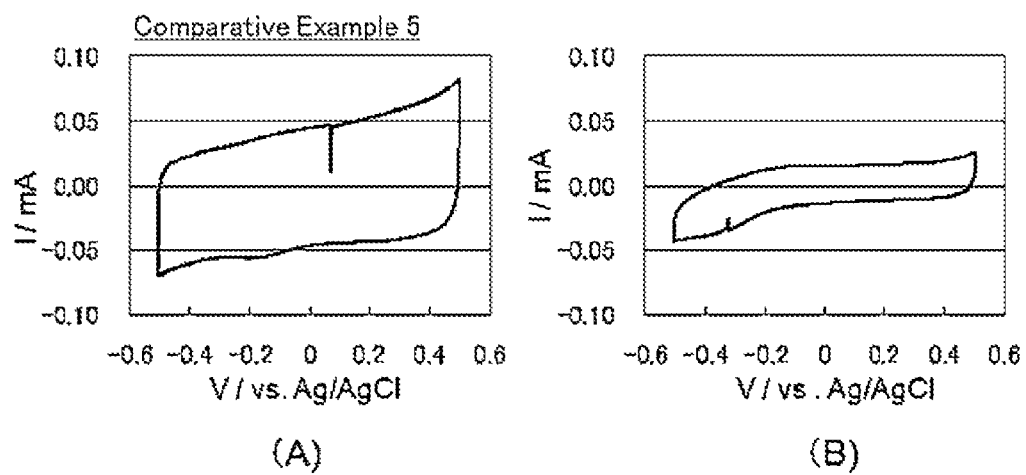
FIG. 7 shows a cyclic voltammogram in an aqueous sodium sulfate solution of an electrode obtained from a polymerization solution containing potassium nitrate and EDOT; (A) shows the measurement result of the early stage and (B) shows the measurement result after a high temperature is experienced.
Figure 8:
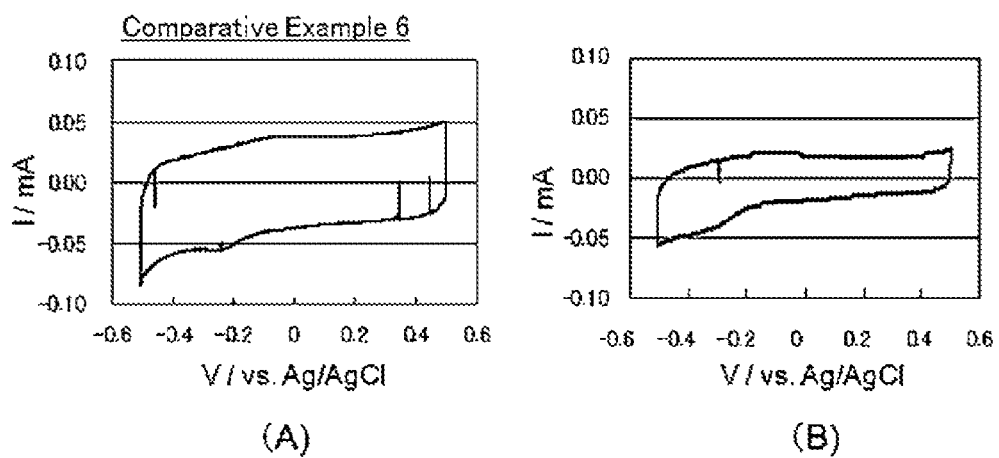
FIG. 8 shows a cyclic voltammogram in an aqueous sodium sulfate solution of an electrode obtained from a polymerization solution containing lithium perchlorate and EDOT; (A) shows the measurement result of the early stage and (B) shows the measurement result after a high temperature is experienced.

A: Electrode Body for a Solar Cell

An electrode body for a solar cell of the present invention comprising a substrate with a conductive part at least on the surface and a conductive polymer layer on the conductive part of the substrate is characterized by the fact that the conductive polymer layer comprises a polymer derived from a substituted thiophene as a monomer and an anion as a dopant to the polymer generated from at least one organic non-sulfonate compound having an anion with the molecular weight of 200 or more, and that the density of the conductive polymer layer is within the range of 1.15 to 1.80 g/cm³. This electrode body for a solar cell can be produced by a method comprising: a preparation process of obtaining a polymerization solution comprising a water-rich solvent, a monomer selected from the substituted thiophenes; and the organic non-sulfonate compound (the organic non-sulfonate supporting electrolyte); and a polymerization process of introducing a substrate with a conductive part at least on the surface to the polymerization solution and performing electrolytic polymerization to form a conductive polymer layer by polymerization of the monomer on the conductive part of the substrate. Detailed explanations of each process are hereinafter given.

(1) Preparation Process

The polymerization solution for electrolytic polymerization prepared in this process comprises as essential components a water-rich solvent, a substituted thiophene as a monomer, and an organic non-sulfonate supporting electrolyte having an anion with the molecular weight of 200 or more. In the preparation of a polymerization solution, water, which has small environmental burden and is economically advantageous, is used as a main solvent. Organic solvents such as methanol, ethanol, isopropanol, butanol, ethylene glycol, acetonitrile, acetone, tetrahydrofuran, and methyl acetate may be contained in the polymerization solution, but 80% by mass or more of the total solvent is water. Water is preferably 90% by mass or more of the total, more preferably 95% by mass or more of the total, and it is especially preferred that the solvent consists only of water. When the amount of the organic solvent contained in the water-rich solvent is increased, a conductive polymer film in which polymer particles are densely filled becomes difficult to be formed on an substrate by electrolytic polymerization, and if the amount of the organic solvent exceeds 20% by mass of the whole solvent, the heat resistance of the conductive polymer layer obtained is remarkably lowered.

As a monomer, a substituted thiophene, that is, a monomer selected from 3,4-disubstituted thiophenes is used. Substituents at the 3- and 4-positions of the thiophene ring can form a ring with carbons at the 3- and 4-positions. Examples of monomers that can be used are; 3,4-dialkylthiophenes such as 3,4-dimethylthiophene and 3,4-diethylthiophene; 3,4-dialkoxythiophenes such as 3,4-dimethoxythiophene and 3,4-diethoxythiophene; 3,4-alkylenedioxythiophenes such as 3,4-methylenedioxythiophene, EDOT and 3,4-(1,2-propylenedioxy)thiophene; 3,4-alkyleneoxythiathiophenes such as 3,4-methyleneoxythiathiophene, 3,4-ethyleneoxythiathiophene and 3,4-(1,2-propyleneoxythia)thiophene; 3,4-alkylenedithiathiophenes such as 3,4-methylenedithiathiophene, 3,4-ethylenedithiathiophene and 3,4-(1,2-propylenedithia)thiophene; and alkylthieno[3,4-b]thiophenes such as thieno[3,4-b]thiophene, isopropylthieno[3,4-b]thiophene and t-butyl-thieno[3,4-b]thiophene. The monomer can be a single compound or two or more types of compounds. In particular, usage of EDOT is preferred.

For a supporting electrolyte in a polymerization solution, an organic non-sulfonate compound having an anion with the molecular weight of 200 or more is used. The anion of the supporting electrolyte is contained in a conductive polymer film as a dopant in the course of the following electrolytic polymerization. Especially, borodisalicylic acid, borodisalicylic salts, a sulfonylimidic acid of the formula (I) or the formula (II)

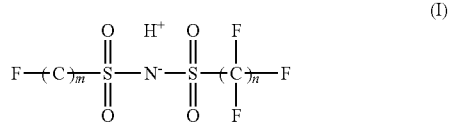
(I)

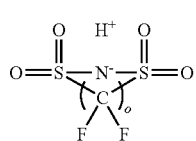
(II)

where m is an integer from 1 to 8, preferably an integer from 1 to 4, especially preferably 2, n is an integer from 1 to 8, preferably an integer from 1 to 4, especially preferably 2, and o is 2 or 3, and salts thereof, are preferably used. For salts, alkali metal salts such as lithium salt, sodium salt and potassium salt; ammonium salt; alkylammonium salts such as ethylammonium salt and butylammonium salt; dialkylammonium salts such as diethylammonium salt and dibutylammonium salt; trialkylammonium salts such as triethylammonium salt and tributylammonium salt; and tetraalkylammonium salts such as tetraethylammonium salt and tetrabutylammonium salt can be exemplified. These supporting electrolytes give conductive polymers with outstanding heat resistance. Among them, salts of bis(pentafluoroethanesulfonyl)imide acid, such as potassium salt, sodium salt, and ammonium salt give a conductive polymer layer with an extremely high heat resistance. Further, borodisalicylic acid and/or its salt give a conductive polymer layer with an especially smooth surface. However, in a case where borodisalicylic acid and/or its salt are used as a supporting electrolyte, they are added to the solution immediately before electrolytic polymerization, or used concurrently with a stabilizer selected from the group consisting of nitrobenzene and nitrobenzene derivatives, which have a function of inhibiting the hydrolysis of borodisalicylate ions. The stabilizer can be a single compound or two or more types of compounds. Examples of nitrobenzene derivatives are: nitrophenol, nitrobenzyl alcohol, nitrobenzoic acid, dinitrobenzoic acid, dinitrobenzene, nitroanisole and nitroacetophenone. O-nitrophenol, m-nitrophenol, p-nitrophenol, or a mixture of these is preferred. The supporting electrolyte can be a single compound or two or more types of compounds, which is used in a concentration of the saturated amount of dissolution or less in the polymerization solution and at an amount with which a sufficient electric current for polymerization can be obtained. The supporting electrolyte is used preferably in a concentration of 10 mM or more.

Preparation of the polymerization solution is performed by the following methods according to the contained amount of the monomer. When the amount of the monomer is a saturated amount of dissolution or less, a polymerization solution is prepared by introducing into a container for manufacturing a polymerization solution the water-rich solvent, a 3,4-disubstituted thiophene as the monomer, and the supporting electrolyte of the specific ranges mentioned above, and by dissolving each component to the water-rich solvent by hand process or by use of a mechanical stirring means. When the amount of the monomer exceeds a saturated amount of dissolution, that is, when the monomer undergoes phase separation by introducing into a container for manufacturing a polymerization solution the water-rich solvent, a 3,4-disubstituted thiophene as the monomer, and the supporting electrolyte of the specific ranges mentioned above and by standing still after stirring and homogenization, the polymerization solution can be prepared by dispersing the phase-separated monomer as oil drops in the polymerization solution by giving ultrasonic wave irradiation to the solution. The polymerization solution of the present invention can also be obtained by dispersing the monomer as oil drops with ultrasonic wave irradiation to a solution in which the monomer at an amount exceeding the saturated amount of dissolution is added to the water-rich solvent, and by adding the supporting electrolyte to the solution obtained. If each of the components in the polymerization solution is stable, there is no restriction on the temperature at the time of preparation.

For ultrasonic wave irradiation, an ultrasonic oscillator which is heretofore been known, such as one for an ultrasonic washing machine or a cell crusher, can be used without any restriction. In order to obtain by ultrasonic wave irradiation a solution in which monomer oil drops are stably dispersed in the water-rich solvent, it is necessary to change the phase-separated monomer to oil drops of a diameter of several μm or less. To achieve this, it is necessary to irradiate the phase-separated solution with ultrasonic wave having a frequency of 15 to 200 kHz, which can generate a cavitation of at least several hundreds of nm to several μm with a strong mechanical action. It is preferable that the output of ultrasonic wave is 4 or more w/cm². Although there is no strict limitation on the time of the ultrasonic wave irradiation, it is preferably within a range of 2 to 10 minutes. If the irradiation time is longer, there is a tendency that aggregation of the monomer oil drops is inhibited and that the time for demulsification is longer, but when the time of the ultrasonic wave irradiation is 10 minutes or more, a tendency that the effect of inhibiting aggregation of the oil drops is saturated. It is also possible to perform more than one irradiations by using ultrasonic waves with different frequencies and/or outputs. The contained amount of monomer exceeding the saturated amount of dissolution is appropriate as long as it is an amount to obtain a dispersion solution in which demulsification is inhibited by ultrasonic wave irradiation and varies according to not only the type of monomer, but also the type and amount of a supporting electrolyte and the condition of ultrasonic wave irradiation.

The polymerization solution in the present invention may contain other additives insofar as they do not give harmful influence on the present invention in addition to the water-rich solvent, the monomer selected from 3,4-disubstituted thiophenes, and the supporting electrolyte within the above-mentioned specific range. A water-soluble nonionic surfactant can be referred to as a preferable additive. Because the monomer is condensed in a micelle of the nonionic surfactant, electrolytic polymerization progresses rapidly, and a polymer exhibiting high conductivity can be obtained. In addition, the nonionic surfactant itself is not ionized, and doping to a polymer by an anion of the supporting electrolyte within the specific range mentioned above is not inhibited. Therefore, heat resistance of the conductive polymer obtained by electrolytic polymerization is not decreased.

As the nonionic surfactant, a water-soluble nonionic surfactant heretofore known can be used without particular restriction. It is possible to use, for example, polyalkylene glycol, polyvinyl alcohol, polyoxyalkylene alkyl ether, polyoxyalkylene alkylphenyl ether, polyoxyalkylene styrylphenyl ether, polyoxyalkylene benzylphenyl ether, polyoxyalkylene alkylphenol ether formaldehyde condensate, polyoxyalkylene styrylphenol ether formaldehyde condensate, polyoxyalkylene benzylphenol ether formaldehyde condensate, alkynediol, polyoxyalkylene alkynediol ether, polyoxyalkylene fatty acid ester, polyoxyalkylene sorbitan fatty acid ester, polyoxyalkylene castor oil, polyoxyalkylene hardened castor oil, polyglycerol alkyl ether and polyglycerol fatty acid ester. These can be used alone or used by mixing two or more types. It is preferable to use in the polymerization solution a combination of an alkynediol having a high dispersion effect such as 2,4,7,9-tetramethyl-5-decyne-4,7-diol with other nonionic surfactants, preferably a polyoxyethylene alkylphenyl ether such as branched polyoxyethylene(9) nonylphenyl ether, because the contained amount of monomer in the polymerization solution can be increased to a great extent.

If the nonionic surfactant is used concurrently, a polymerization solution is prepared by introducing into a container for manufacturing a polymerization solution the water-rich solvent, the monomer, the supporting electrolyte within the specific range mentioned above and the nonionic surfactant, and by dissolving each component into the water-rich solvent by hand processing or a mechanical stirring means or an ultrasonic wave radiation. Also, after introducing into a container for producing a polymerization solution the water-rich solvent, the monomer, and the nonionic surfactant and preparing a solution in which each component is dissolved in the water-rich solvent, dissolution can be made by adding the supporting electrolyte within the specific range mentioned above to this solution immediately before electrolytic polymerization.

(2) Polymerization Process

By introducing a working electrode (a substrate of a conductive polymer layer) with a conductive part at least on the surface and a counter electrode into the polymerization solution obtained by the above-mentioned preparation process, and then performing electrolytic polymerization, a conductive polymer layer by polymerization of the substituted thiophene is formed on the conductive part of the working electrode and an electrode body for a solar cell is obtained. The nature, shape and size of the working electrode are selected according to the intended usage of the electrode body for a solar cell.

In a case where an electrode body for a solar cell is to be used as a positive electrode and a hole extraction layer of an organic thin-film solar cell, a substrate with a conductive part, which has a larger work function than that of a negative electrode to be used in the organic thin-film solar cell, is selected as the working electrode. For example, a substrate with a layer of a metal with a larger work function such as gold, silver, cobalt, nickel and platinum, or a layer of a semi-conductive ceramic such as indium oxide, tin-doped indium oxide (ITO), zinc-doped indium oxide (IZO), tin oxide, antimony-doped tin oxide (ATO), fluorine-doped tin oxide (FTO), zinc oxide, aluminum-doped zinc oxide (AZO) at least on the surface, can be used as the working electrode. The conductive part can be a single layer or a combination of layers with different work functions.

Since the conductive polymer layer obtained by this polymerization process has excellent transparency, it is preferable to use as the working electrode a transparent substrate in which a transparent layer of conductive material such as indium oxide, ITO, IZO, tin oxide, ATO, FTO, zinc oxide, and AZO is formed by vapor deposition or coating on the surface of an insulating transparent substrate of glass such as optical glass, quartz glass, and alkali-free glass or plastic such as polyethylene terephthalate, polyethylene naphthalate, polycarbonate polyethersulfone, and polyacrylate.

In a case where an electrode body for a solar cell is to be used as a positive electrode of a dye-sensitized solar cell, a substrate with a conductive part at least on the surface can be used as the working electrode, and the conductive part can be a single layer or include multiple different layers. For example, a plate or foil of conductive material such as platinum, gold, nickel, titanium, steel, rhodium and ruthenium can be used as the working electrode. However, since the conductive polymer layer obtained by this polymerization process has excellent transparency, it is preferable to use as the working electrode a transparent substrate in which a transparent layer of conductive material such as indium oxide, ITO, IZO, tin oxide, ATO, FTO, zinc oxide, and AZO is formed by vapor deposition or coating on the surface of an insulating transparent substrate of glass such as optical glass, quartz glass, and alkali-free glass or plastic such as polyethylene terephthalate, polyethylene naphthalate, polycarbonate polyethersulfone, and polyacrylate. Moreover, a substrate in which a film of a metal such as platinum, nickel, titanium, rhodium and ruthenium is formed by vapor deposition or coating on the above-mentioned glass substrate or plastic substrate can be used as the working electrode.

As the counter electrode of electrolytic polymerization, a board of platinum, nickel or the like can be used.

Electrolytic polymerization is performed using the polymerization solution obtained in the preparation process by any of a potentiostatic method, a galvanostatic method or a potential sweep method. In the case of the potentiostatic method, a potential of 1.0 to 1.5 V for a saturated calomel electrode is preferable though this depends on the type of monomer; and in the case of galvanostatic method, a current value of 1 to 10000 $\mu A/cm^2$, preferably 5 to 500 $\mu A/cm^2$, more preferably 10 to 100 $\mu A/cm^2$ is preferable though this depends on the type of monomer; and in the case of the potential sweep method, it is preferable to sweep a range of −0.5 to 1.5 V for a saturated calomel electrode at a velocity of 5 to 200 mV/s though this depends on the type of monomer.

By electrolytic polymerization, a conductive polymer layer, in which an anion of the organic non-sulfonate supporting electrolyte within the specific range mentioned above is included as a dopant, is formed on the conductive part of the working electrode. The density of the conductive polymer layer obtained is within the range of 1.15 to 1.80 $g/cm^3$. If the density of the conductive polymer layer is less than 1.15 $g/cm^3$, heat resistance rapidly decreases, and the manufacture of a conductive polymer layer with a density of more than 1.80 $g/cm^3$ is difficult. The density of the conductive polymer layer with excellent heat resistance is preferably within the range of 1.20 to 1.80 $g/cm^3$, and especially preferably within the range of 1.60 to 1.80 $g/cm^3$. When a flexible electrode body for a solar cell is to be obtained, since a conductive polymer layer becomes hard and less flexible if the density of the conductive polymer is too high, the density of the conductive polymer is preferably 1.75 $g/cm^3$ or less, and more preferably 1.70 $g/cm^3$ or less. The thickness of the conductive polymer layer is generally within the range of 1 to 2000 nm, preferably 35 to 350 nm, and especially preferably 70 to 350 nm. If the thickness is less than 1 nm, the smoothing effect of the asperity of the conductive part in the substrate, which is important when using the conductive polymer layer as a component of an organic thin-film solar cell, becomes difficult to be obtained, and the catalytic activity to convert an oxidized species of the electrolyte layer into a reduced species, which is important when using the conductive polymer layer as a component of a dye-sensitized solar cell, becomes insufficient. If the thickness is more than 2000 nm, it is not preferable because the internal resistance of the conductive polymer layer becomes large. A polymerization temperature has no strict limitation, but is generally within a range of 10 to 60 degrees centigrade. A polymerization time changes according to the composition of a polymerization solution and the conditions of electrolytic polymerization, but it is generally within a range of 0.6 seconds to 2 hours, preferably 1 to 10 minutes, and especially preferably 2 to 6 minutes. When a transparent substrate is used as the working electrode, it is preferable that the transmittance of the light that transmits through both the transparent substrate and the conductive polymer layer is about 80% or more, and preferably about 85% or more so that a sufficient quantity of light is irradiated into a photoelectric conversion layer.

By cleaning the conductive polymer layer after electrolytic polymerization with water, ethanol or the like, and drying it, an electrode body for a solar cell in which a conductive polymer layer with excellent heat resistance is formed with good adhesion on a substrate can be obtained. The conductive polymer layer in the electrode body for a solar cell of the present invention is air-moisture stable, and there is no danger that other components will be eroded in the process of manufacture or usage of the solar cell because the conductive polymer layer has the pH value close to a neutral value.

B: Solar Cell

The electrode body for a solar cell obtained by the present invention can be suitably used as a component for a dye-sensitized solar cell or a component for an organic thin-film solar cell.

The organic thin-film solar cell comprises a positive electrode with a conductive part at least on the surface, a hole extraction layer located on the conductive part of the positive electrode, a photoelectric conversion layer located on the hole extraction layer having a hole transporter and an electron transporter, and a negative electrode located on the photoelectric conversion layer. The electrode body for a solar cell obtained by the present invention can be suitably used as a component in which a positive electrode and a hole extraction layer are laminated monolithically, and the conductive polymer layer formed on the conductive part of the substrate has excellent hole transportation capability and heat resistance compared with a conventional PEDOT:PSS layer.

The photoelectric conversion layer in the organic thin-film solar cell contains a hole transporter (p-type semiconductor) and an electron transporter (n-type semiconductor). As the hole transporter, a compound used as a hole transporter in a conventional organic thin-film solar cell is used without any restriction, and polyphenylene and its derivatives, polyphenylene vinylene and its derivatives, polysilane and its derivatives, polyalkylthiophene and its derivatives, porphyrin derivatives, phthalocyanine and phthalocyanine derivatives can be exemplified. For the electron transporter, a compound used as an electron transporter in a conventional organic thin-film solar cell can be used without any restriction, and fullerene and fullerene derivatives, carbon nanotube, polyfluorene derivatives, perylene derivatives, polyquinone derivatives, a polymer having a cyano group or a trifluoromethyl group can be exemplified. For the hole transporter and the electron transporter, a single compound can be used, or a mixture of two types or more can also be used.

The photoelectric conversion layer may be a bilayer type in which a hole transporter and an electron transporter are stacked in layers, or a bulk hetero type in which a hole transporter and an electron transporter are mixed, or a p-i-n type in which a mixed layer of a hole transporter and an electron transporter is formed between a hole transporter and an electron transporter. In case of the bilayer type or the p-i-n type, the hole transporter is located immediately on the conductive polymer layer in the electrode body for a solar cell of the present invention.

The thickness of the photoelectric conversion layer is generally within the range of 1 to 3000 nm, preferably within the range of 1 to 600 nm. If the thickness of the photoelectric conversion layer is more than 3000 nm, it is not preferable because the internal resistance of the photoelectric conversion layer becomes high. If the thickness of the photoelectric conversion layer is less than 1 nm, a negative electrode and a conductive polymer layer may make contacts.

For the negative electrode in the organic thin-film solar cell, a substrate at least on the surface having a conductive part with a work function lower than that of the conductive part of the substrate contained in the electrode body for a solar cell of the present invention (the positive electrode of the organic thin-film solar cell) is used. For example, a substrate at least on the surface having a layer of metal or alloy such as lithium, aluminum, aluminum-lithium alloy, calcium, magnesium and magnesium-silver alloy can be used as the negative electrode. The conductive part can be a single layer or a multilayer with different work functions.

Also, if a substrate contained in the electrode body for a solar cell of the present invention is opaque, a transparent substrate is used as the negative electrode. For such a negative electrode, a transparent substrate in which a transparent conductive layer such as indium oxide, ITO, IZO, tin oxide, ATO, FTO, zinc oxide, and AZO layer is formed by vapor deposition or coating on the surface of an insulating transparent substrate of glass such as optical glass, quartz glass and alkali-free glass, or plastic such as polyethylene terephthalate, polyethylene naphthalate, polycarbonate polyethersulfone and polyacrylate, can be suitably used.

The organic thin-film solar cell can be obtained with a heretofore known method by using the electrode body for a solar cell of the present invention. For example, the cell can be obtained by forming a photoelectric conversion layer on the conductive polymer layer of the electrode body for a solar cell of the present invention, according to the kind of a hole transporter and an electron transporter to be used, by a dry process such as a vacuum deposition method and a sputtering method, or by a wet process such as spin coat, bar coat and cast coating by using a solution in which a hole transporter and/or an electron transporter are added to a solvent such as toluene, chlorobenzene or ortho-dichlorobenzene, heating and drying the photoelectric conversion layer obtained if necessary, then forming a negative electrode by a vacuum deposition method or a sputtering method. The cell can also be obtained by filling a solution containing a hole transporter and an electron transporter between the conductive polymer layer in the electrode body for a solar cell of the present invention and a conductive part of a negative electrode, and then heating and drying the solution.

The dye-sensitized solar cell of the present invention comprises a negative electrode having a semiconductor layer with a pigment as a photosensitizer, an electrolyte layer located on the semiconductor layer of the negative electrode having paired oxidized species and reduced species, and a positive electrode located on the electrolyte layer having a conductive polymer layer that acts as a catalyst to convert the oxidized species into the reduced species. The electrode body for a solar cell of the present invention can be used suitably as a positive electrode, and the conductive polymer layer formed on the conductive part of a substrate has enough catalytic capability to convert the oxidized species into the reducing species in the redox pair.

For the conductive substrate and the semiconductor layer composing the negative electrode in the dye-sensitized solar cell, a conductive substrate and a semiconductor layer in a conventional dye-sensitized solar cell can be used without any restriction.

As the conductive substrate, a substrate with a conductive part at least on the surface can be used, and the conductive part of the substrate may be a single layer or may contain different kinds of multilayer. For example, a plate or a foil of conductive material such as platinum, nickel, titanium, steel, chromium, niobium, molybdenum, ruthenium, rhodium, tantalum, tungsten, iridium and hastelloy can be used as the substrate, or, a transparent substrate in which a transparent conductive layer such as indium oxide, ITO, IZO, tin oxide, ATO, FTO, zinc oxide, ATO, FTO layer is formed by vapor deposition or coating on the surface of an insulating transparent substrate of glass such as optical glass, quartz glass and alkali-free glass, or plastic such as polyethylene terephthalate, polyethylene naphthalate, polycarbonate polyethersulfone and polyacrylate, can be also used. Moreover, a substrate in which a metallic film such as platinum, nickel, titanium, rhodium and ruthenium film is formed by vapor deposition or coating on the above-mentioned glass substrate or plastic substrate can be used. In case a substrate contained in the electrode body for a solar cell of the present invention is opaque, a transparent substrate is used as a substrate in the negative electrode. Moreover, if the substrate contained in the electrode body for a solar cell obtained by the present invention is transparent, a fully-transparent solar cell can be composed by using a transparent substrate also for the negative electrode.

The semiconductor layer can be formed by using an oxide semiconductor such as titanium oxide, zirconium oxide, zinc oxide, tin oxide, nickel oxide, niobium oxide, magnesium oxide, tungstic oxide, bismuth oxide, indium oxide, thallium oxide, lanthanum oxide, yttrium oxide, phosphonium oxide, cerium oxide, aluminum oxide, cadmium sulfide, cadmium selenide, cadmium telluride, calcium titanate, strontium titanate and barium titanate. As the oxide semiconductor, a single compound can be used, or two or more types can be mixed and used. It is preferable that titanium oxide, which has high photoelectric conversion efficiency, is used. The oxide semiconductor is generally used in a porous embodiment so that many pigments can be supported in the semiconductor layer.

As the pigment that acts as a photosensitizer, an organic dye or a metal complex dye that has absorption in the visible light region and/or the infrared light range can be used. As an organic dye, pigments such as coumalins, cyanines, merocyanines, phthalocyanines, porphyrins, azos, quinones, quinone imines, quinacridones, squaryliums, triphenylmethanes, xanthenes, perylenes, indigos and naphthalocyanines can be used, and it is preferable to use a coumalin pigment. As a metal complex dye, osmium complexes, ruthenium complexes, iron complexes, zinc complexes, platinum complexes, or palladium complexes can be used, and especially, it is preferable to use a ruthenium bipyridine complex such as N3 and N719 or a ruthenium terpyridine complex such as N749 and a ruthenium quaterpyridine complex in that they have a wide absorption band. Moreover, it is preferable to use a pigment with an interlocking group such as carboxyl group, alkoxy group, hydroxyl group, hydroxyalkyl group, sulfonic acid group, ester group, mercapto group, phosphonyl group in a pigment molecule for a pigment to be absorbed firmly in a porous semiconductor oxide layer and to facilitate electron transfer between the pigment in an excited state and the conduction band of a porous semiconductor oxide layer, and among them, it is especially preferable to use one with a carboxyl group. Also, if a part of an acidic functional group such as carboxyl group is anionized by neutralization with alkali metal hydroxide, tetraalkylammonium hydroxide, imidazolium hydroxide and pyridinium hydroxide, association between pigment molecules are inhibited by a repulsive force among anions, and significant reduction of an electron trap between dye molecules can be realized. For these pigments, a single compound can be used, or a mixture of two or more types can also be used.

The negative electrode of the dye-sensitized solar cell can be obtained by a heretofore known method. For example, the porous layer of an oxide semiconductor is formed on a substrate by applying a dispersion containing oxide semiconductor particles and an organic binder such as polytetrafluoroethylene, polyvinylidene fluoride and carboxymethylcellulose by a wet process such as spin coat, bar coat or cast coating, heating and drying the dispersion, and then firing at a temperature of 400 to 500 degrees centigrade. As an oxide semiconductor particle, a particle in a spherical shape, rod-shape, or needle shape with an average primary particle 1 to 200 nm is preferably used. Moreover, to improve the necking among oxide semiconductor particles, electron transportation characteristics and photoelectric conversion efficiency, it is also acceptable that a $TiCl_4$ solution is osmosed in the porous layer of an oxide semiconductor, its surface is washed with water, and then it is burned at a temperature of 400 to 500 degrees centigrade. Then, the substrate after firing is immersed in a solution in which the above-mentioned pigment is dissolved into a solvent such as ethanol, isopropyl alcohol and butylalcohol, is taken out from the immersion fluid after the predetermined time is elapsed, is dried and the pigment is supported in the oxide semiconductor, so that a negative electrode can be obtained. It is preferable that, after the pigment is supported in the oxide semiconductor, the substrate obtained is immersed in a solution containing a inhibitor of reverse electron transfer with a functional group that combines with a semiconductor including imidazolyl group, carboxy group and phosphonate group, for example, tert-butylpyridine, 1-methoxybenzimidazole and a phosphonic acid with a long-chain alkyl group (the carbon number: approximately 13) such as decan phosphoric acid, and the inhibitor of reverse electron transfer is adsorbed in the interspace between the pigments on the semiconductor surface, because reverse electron transfer in the electrolyte is prevented and elution of the pigment becomes difficult into the electrolyte. The thickness of the semiconductor layer is generally within the range of 1 to 100 µm, preferably 3 to 50 µm. If the thickness of the semiconductor layer is less than 1 µm, the light absorption can be insufficient, and the thickness of the semiconductor layer is more than 100 µm, it is not preferable because the travel distance of the electron from the oxide semiconductor to the conductive part of the substrate becomes long and the electron becomes deactivated.

As the electrolyte to compose the electrolyte layer of the dye-sensitized solar cell, an electrolyte in which a combination of metal or organic iodide and iodine constituting an iodine redox pair, a combination of a metal or organic bromide and bromine constituting a bromine redox pair, or a Co(II) polypyridine complex constituting a cobalt complex redox pair is dissolved into an organic solvent such as acetonitrile, methoxyacetonitrile, 3-methoxypropionitrile, propylene carbonate, ethylene carbonate, γ-butyrolactone and ethylene glycol can be used. In addition, as a redox pair, a metal complex such as ferrocyanide/ferricyanide and ferrocene/ferricinium ion, a sulfur compound such as sodium polysulfide and alkylthiol/alkyl disulfide, viologen dye, and hydroquinone/quinone can be used. As a cation of the metallic compound, Li, Na, K, Mg, Ca and Cs are preferable, and as a cation of the organic compound, tetraalkylammoniums pyridiniums and imidazoliums are preferable. Among them, it is preferable to use the combination of iodide and iodine, which has high photoelectric conversion efficiency, and especially, it is preferable to use the combination of $I_2$ and an alkali metal iodide including LiI, NaI and KI, an imidazolium compound such as dimethylpropyl imidazolium iodide or a quaternary ammonium iodide. The concentration of the salt in the organic solvent is preferably 0.05 to 5 M, more preferably 0.2 to 2 M. The concentration of $I_2$ and $Br_2$ is preferably 0.0005 to 1 M, more preferably 0.001 to 0.2 M. Moreover, various additives such as 4-tert-butylpyridine and carboxylic acid can be added to improve the open voltage of a dye-sensitized solar cell. Further, a supporting electrolyte such as lithium iodide and lithium tetrafluoroborate may be added if necessary to the electrolyte.

The electrolyte layer can be formed by gel electrolyte in which the electrolyte becomes pseudo-solid with addition of gelatinizer. If it is made a physical gel, polyacrylonitrile, and polyvinylidene fluoride can be used as gelatinizer, and if it is made a chemical gel, a combination of acryl(methacryl)ester oligomer or tetra(bromomethyl)benzene and polyvinylpyridine can be used as gelatinizer.

The dye-sensitized solar cell can be obtained by a heretofore known method by using the electrode body for a solar cell of the present invention. For example, the cell can be obtained by placing the semiconductor layer of a negative electrode and the conductive polymer layer of the electrode body for a solar cell of the present invention at a given interval, injecting electrolyte in the interval, and heating if necessary to form an electrolyte layer. The thickness of the electrolyte layer is, except for the thickness of the electrolyte layer osmosed in the semiconductor layer, generally within the range of 1 to 100 μm, preferably within the range of 1 to 50 μm. If the thickness of the electrolyte layer is less than 1 μm, the semiconductor layer of the negative electrode may short-circuit, and if the thickness of the electrolyte layer is more than 100 μm, it is not preferable because the internal resistance becomes high.

EXAMPLES

The examples of the present invention are shown as follows, but the present invention is not limited to the following examples.

(I) Influence of a Supporting Electrolyte
(a) Manufacture of an Electrode Body for a Solar Cell Example 1

A solution in which the total amount of EDOT was dissolved in water was obtained by introducing 50 mL of distilled water into a glass container, adding to this 0.105 g (concentration: 0.0148 M) of EDOT and stirring it at 25 degrees centigrade for 60 minutes. Then, sodium bis(pentafluoroethanesulfonyl)imide was dissolved at the concentration of 0.08 M into this solution, and a polymerization solution was obtained.

An ITO electrode as a working electrode with an area of 1 $cm^2$, a platinum mesh as a counter electrode with an area of 4 $cm^2$, and a silver-silver chloride electrode as a reference electrode were introduced to the obtained polymerization solution, and galvanostatic electrolytic polymerization was performed for 60 seconds under a current condition of 10 $\mu A/cm^2$. The working electrode after electrolytic polymerization was washed with methanol, and then dried at 150 degrees centigrade for 30 minutes, and an electrode body in which a conductive polymer layer was formed on the ITO electrode was obtained.

Example 2

The procedure of Example 1 was repeated by using ammonium borodisalicylate instead of sodium bis(pentafluoroethanesulfonyl)imide.

Example 3

A solution in which EDOT and water were phase-separated was obtained by introducing 50 mL of distilled water into a glass container and adding to this 0.14 g (concentration: 0.02 M) of EDOT. When an ultrasonic wave of 20 kHz frequency and 2.6 $W/cm^2$ output was irradiated into this solution for 5 minutes, an emulsion in which EDOT was dispersed in water as oil drops was obtained. When the size of the EDOT oil drops of this emulsion was measured by a dynamic light scattering method at 25 degrees centigrade, the average diameter of the oil drops was 214 nm. Then, ammonium borodisalicylate was dissolved at the concentration of 0.08 M in this emulsion, and a polymerization solution containing EDOT oil drops was obtained.

An ITO electrode as a working electrode with an area of 1 $cm^2$, a platinum mesh as a counter electrode with an area of 4 $cm^2$, and a silver-silver chloride electrode as a reference electrode were introduced to the obtained polymerization solution, and galvanostatic electrolytic polymerization was performed for 60 seconds under a current condition of 10 $\mu A/cm^2$. The working electrode after electrolytic polymerization was washed with methanol, and then dried at 150 degrees centigrade for 30 minutes, and an electrode body in which a conductive polymer layer was formed on the ITO electrode was obtained.

Example 4

A solution in which the total amount of EDOT was dissolved in water was obtained by introducing 50 mL of distilled water into a glass container, adding to this 0.105 g (concentration: 0.0148 M) of EDOT and stirring it at 25 degrees centigrade for 60 minutes. Then, sodium bis(pentafluoroethanesulfonyl)imide was dissolved at the concentration of 0.08 M into this solution, and a polymerization solution was obtained.

An ITO electrode as a working electrode with an area of 1 $cm^2$, a platinum mesh as a counter electrode with an area of 4 $cm^2$, and a silver-silver chloride electrode as a reference electrode were introduced to the obtained polymerization solution, and galvanostatic electrolytic polymerization was performed for 60 seconds under a current condition of 100 $\mu A/cm^2$. The working electrode after electrolytic polymerization was washed with methanol, and then dried at 150 degrees centigrade for 30 minutes, and an electrode body in which a conductive polymer layer was formed on the ITO electrode was obtained.

Example 5

The procedure of Example 4 was repeated by using ammonium borodisalicylate at the concentration of 0.08 M and p-nitrophenol at the concentration of 0.05 M instead of using sodium bis(pentafluoroethanesulfonyl)imide at the concentration of 0.08 M.

Comparative Example 1

100 μL of commercially available aqueous PEDOT:PSS dispersion (trade name: Baytron P, manufactured by H. C. Starck) was cast on an ITO electrode with an area of 1 $cm^2$ and spin coating was carried out for 30 seconds at the rotation frequency of 5000 rpm. Then, it was dried at 150 degrees centigrade for 30 minutes and an electrode body in which a conductive polymer layer was formed on the ITO electrode was obtained.

Comparative Example 2

A polymerization solution was obtained by introducing 50 mL of distilled water into a glass container, adding to this 0.14 g (concentration: 0.02 M) of EDOT and 1.08 g of sodium butylnaphthalene sulfonate as a surfactant having a sulfonic acid salt group, and stirring it at 25 degrees centigrade for 60 minutes. An ITO electrode as a working electrode with an area of 1 cm$^2$, a platinum mesh as a counter electrode with an area of 4 cm$^2$, and a silver-silver chloride electrode as a reference electrode were introduced to the polymerization solution obtained, and galvanostatic electrolytic polymerization was performed for 60 seconds under a current condition of 10 µA/cm$^2$. The working electrode after electrolytic polymerization was washed with methanol, and then dried at 150 degrees centigrade for 30 minutes, and an electrode body in which a conductive polymer layer was formed on the ITO electrode was obtained.

Comparative Example 3

The procedure of Example 1 was repeated by using sodium p-toluenesulfonate instead of sodium bis(pentafluoroethanesulfonyl)imide.

Comparative Example 4

The procedure of Example 1 was repeated by using citric acid instead of sodium bis(pentafluoroethanesulfonyl)imide.

Comparative Example 5

The procedure of Example 1 was repeated by using potassium nitrate instead of sodium bis(pentafluoroethanesulfonyl)imide.

Comparative Example 6

The procedure of Example 1 was repeated by using lithium perchlorate instead of sodium bis(pentafluoroethanesulfonyl)imide.

(b) Evaluation of Surface Roughness

For the electrode bodies of Examples 4 and 5, root mean square roughness (RMS) of the surface of the conductive polymer layer was calculated by observing a surface area 100×100 µm$^2$ in size in the central part of the polymer layer with an atomic force microscope. FIG. 1 shows the observation and the RMS values calculated. The polymer layer of the electrode body of Example 5 (dopant: borodisalicylate anion, RMS: 3.0 nm) had an extremely flat surface compared with the polymer layer of the electrode body in Example 4 (dopant: bis(pentafluoroethanesulfonyl)imide anion, RMS: 9.6 nm). If an electrode body with a conductive polymer layer with a large asperity on the surface is used as a component in an organic thin-film solar cell, that is, as a component in which a positive electrode and a hole extraction layer is united, a short circuit may occur between the photoelectric conversion layer and the positive electrode in an area where the conductive polymer layer is thin, and the transport efficiency of a hole from the photoelectric conversion layer to the positive electrode may be decreased because the adhesion between the photoelectric conversion layer and the conductive polymer layer or the adhesion between the conductive polymer layer and the positive electrode is reduced. By using a borodisalicylate anion as a dopant of the conductive polymer layer, these problems are less likely to occur.

(c) Evaluation of Electrochemical Response in a Sodium Sulfate Electrolyte

The hole transportation capability of the electrode bodies in Examples 1 to 3 and Comparative Examples 1 to 6 was evaluated by cyclic voltammograms. Any one of the electrode bodies in Examples 1 to 3 and Comparative Examples 1 to 6 as a working electrode, a platinum mesh as a counter electrode with an area of 4 cm$^2$ and a silver-silver chloride electrode as a reference electrode were introduced in an electrolytic solution in which sodium sulfate (concentration: 1 M) was dissolved in water, and the cyclic voltammogram was evaluated with a scanning potential range of −0.5V to +0.5 V, with a scanning rate of 10 mV/s. For the electrode bodies in Comparative Examples 3 and 4, a stable cyclic voltammogram could not be obtained.

Then, the electrode bodies of Examples 1 to 3 and Comparative Examples 1, 2, 5, and 6 were taken out of the electrolytic solution, and after washing, thermal aging was applied for 330 hours at 150 degrees centigrade in the atmosphere, and cyclic voltammograms were obtained again.

FIGS. 2 to 8 show the cyclic voltammograms before and after thermal aging. FIG. 2, FIG. 3, FIG. 4, FIG. 5, FIG. 6, FIG. 7 and FIG. 8, in this order, show cyclic voltammograms of the electrode body of Example 1 (dopant: bis(pentafluoroethanesulfonyl)imide anion), Example 2 (dopant: borodisalicylate anion), Example 3 (dopant: borodisalicylate anion, a polymerization solution into which an ultrasonic wave was irradiated), Comparative Example 1 (dopant: PSS anion), Comparative Example 2 (dopant: butylnaphthalene sulfonate anion), Comparative Example 5 (dopant: nitrate anion) and Comparative Example 6 (dopant: perchlorate anion). (A) is an early-stage cyclic voltammogram and (B) is a cyclic voltammogram after thermal aging. It can be concluded that the larger the electrochemical response in a cyclic voltammogram, the more excellent hole transportation capability the electrode body has, while the less the cyclic voltammograms change before and after thermal aging, the more excellent heat resistance the electrode body has.

By comparing the early stage cyclic voltammograms, it can be seen that the electrode body with a PEDOT:PSS layer in Comparative Example 1 shows a remarkably small current response compared with other electrode bodies and has little electrochemical activity. By comparing the cyclic voltammograms before and after thermal aging, it can be seen that the electrode bodies in Examples 1 to 3 show a remarkably small decrease in current response due to heat experience compared with the electrode bodies in Comparative Examples 1, 2, 5 and 6. Therefore, it was found that the electrode body of the present invention has excellent hole transportation capability and excellent heat resistance. Also, the electrode body in Example 2 shows almost the same cyclic voltammogram result as the electrode body in Example 3, and it was found that an electrode body with equivalent excellent heat resistance could be obtained whether the amount of EDOT in a polymerization solution is equal to saturated solubility or less, or is more than saturated solubility.

In order to increase the aqueous concentration of EDOT with low water solubility, anionic surfactants with a sulfonic acid group or sulfonic acid salt group have been frequently used as a supporting electrolyte, and it is reported that a PEDOT layer in which an anion of these surfactants are doped has excellent thermal durability because de-doping is inhibited by the bulkiness of the dopant. For example, JP 2000-269087 A reports electrolytic polymerization with a polymerization solution of an aqueous medium in which a thiophene derivative such as EDOT is emulsified by an alkylnaphthalene sulphonate surfactant, where a stable conductive polymer layer is obtained at high temperature and high humidity because de-doping is inhibited due to the bulkiness of the alkylnaphthalene sulfonate anion taken into the polymer layer as a dopant.

Comparing the cyclic voltammograms of the electrode bodies in Comparative Examples 1 and 2 with those of the electrode bodies in Comparative Examples 5 and 6, it can be seen that the former showed a small decrease in current response due to heat experience, but the electrode bodies in Examples 1 to 3 showed even more excellent heat resistance. Especially, the electrode body in Example 1 obtained from the polymerization solution including sodium bis(pentafluoroethanesulfonyl)imide as a supporting electrolyte showed an extremely excellent thermal stability.

Therefore, it was found that the electrode body for a solar cell obtained from the manufacturing method of the present invention has more excellent hole transportation capability than the conventional electrode body with a PEDOT:PSS layer and, moreover, has a more excellent heat resistance than the electrode body with a PEDOT layer containing an anion of the surfactant with a bulky sulfonic acid group or sulfonic acid salt group as a dopant. From this result, it was concluded that the electrode body for a solar cell of the present invention is suitable as a component in an organic thin-film solar cell, that is, as a component in which a positive electrode and a hole extraction layer are united.

(d) Evaluation of Electrochemical Response in $I^-/I_3^-$ Electrolyte

For the electrode bodies of Examples 1 and 2 and of Comparative Example 2, which showed comparatively excellent heat resistance in the evaluation in sodium sulphate electrolyte, electrochemical response in $I^-/I_3^-$ electrolyte was evaluated by cyclic voltammograms.

An electrode body as a working electrode of any one of Examples 1 and 2, and Comparative Example 2, a platinum mesh as a counter electrode with an area of 4 cm$^2$, and a silver-silver chloride electrode as a reference electrode were introduced in an electrolyte in which 10 mM lithium iodide, 1 mM iodine, and 1 M lithium tetrafluoroborate were dissolved in acetonitrile, and the cyclic voltammogram was evaluated with a scanning potential range of −0.8 to +0.8 V, with a scanning rate of 10 mV/s.

Then, the electrode bodies of Example 1 and 2, and Comparative Example 2 were taken out of the electrolyte, and after washing, thermal aging was carried out for 700 hours at 130 degrees centigrade in the atmosphere, and cyclic voltammograms were obtained again.

Figure 9:
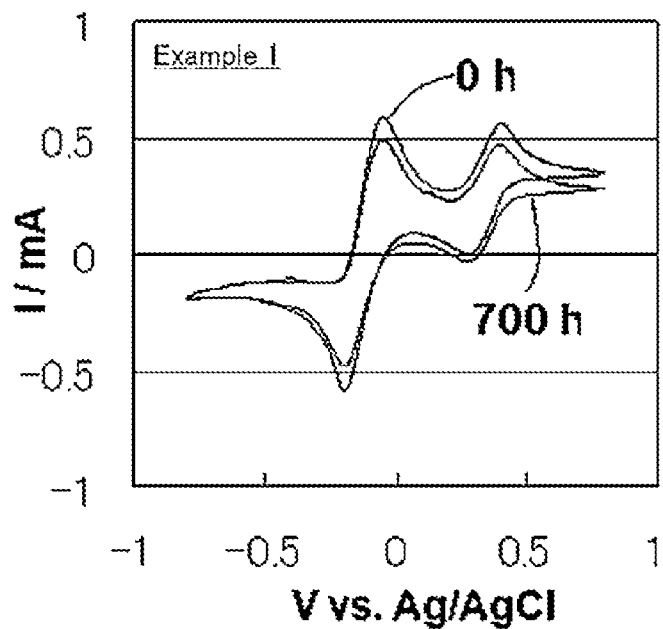
FIG. 9 shows a cyclic voltammogram in an electrolyte, which contains an $I^-/I_3^-$ redox pair, of an electrode body obtained from a polymerization solution containing sodium bis(pentafluoroethanesulfonyl)imide and EDOT at the saturated solution amount or less.
Figure 10:
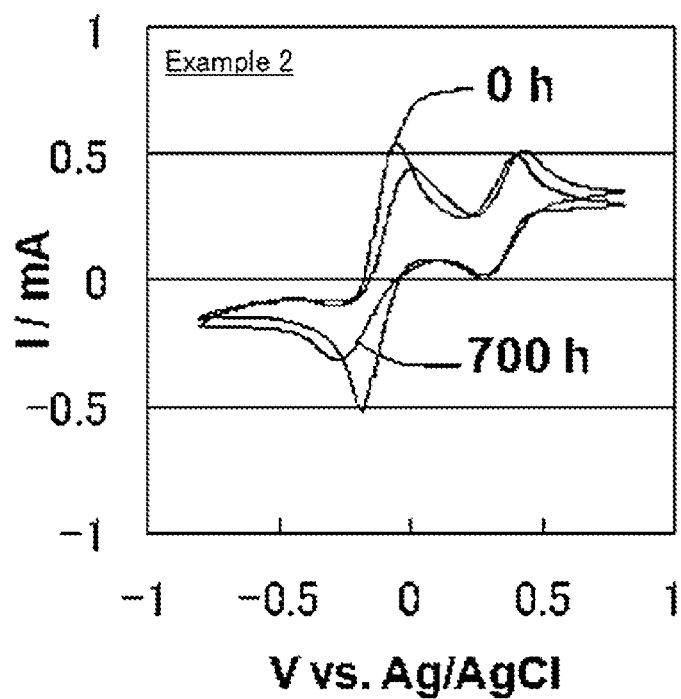
FIG. 10 shows a cyclic voltammogram in an electrolyte, which contains an $I^-/I_3^-$ redox pair, of an electrode body obtained from a polymerization solution containing ammonium borodisalicylate and EDOT at the saturated solution amount or less.
Figure 11:
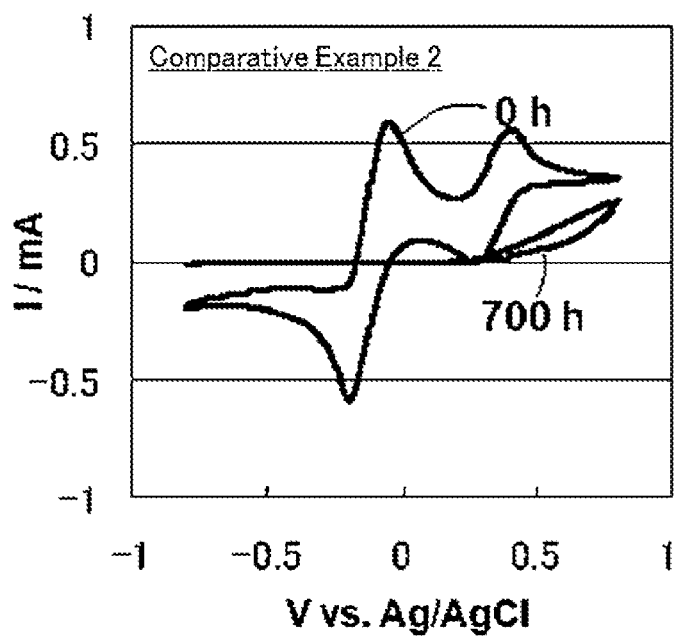
FIG. 11 shows a cyclic voltammogram in an electrolyte, which contains an $I^-/I_3^-$ redox pair, of an electrode body obtained from a polymerization solution containing sodium butylnaphthalene sulfonate and EDOT.

FIGS. 9 to 11 show cyclic voltammograms before and after thermal aging. FIG. 9, FIG. 10, and FIG. 11 show cyclic voltammograms of the electrode body of Example 1 (dopant: bis(pentafluoroethanesulfonyl)imide anion), Example 2 (dopant: borodisalicylate anion) and Comparative Example 2 (dopant: butylnaphthalene sulfonate anion) in this order.

In the early-stage, two pairs of oxidation-reduction waves were found in all the cyclic voltammograms of the electrode bodies of Example 1, Example 2 and Comparative Example 2. The oxidation-reduction wave on the negative potential side is an oxidation-reduction wave corresponding to $I_3^-/I^-$, and the oxidation-reduction wave on the positive potential side is an oxidation-reduction wave corresponding to $I_2^-/I_3^-$. In a dye-sensitized solar cell, the reduction wave from $I_3^-$ to $I^-$ that was found around −0.2 V against the silver-silver chloride electrode is especially important, because sufficient reproduction of $I^-$ is required.

After thermal aging, none of the two pairs of oxidation-reduction waves were shown in the cyclic voltammogram of the electrode body of Comparative Example 2, while in both of the cyclic voltammograms of the electrode bodies of Examples 1 and 2, two pairs of oxidation-reduction waves were clearly found.

Therefore, it was concluded that the conductive polymer layer in the electrode body for a solar cell of the present invention has excellent reduction catalytic activity to convert an oxidizing species ($I_3^-$) into a reducing species ($I^-$) and, moreover, has more excellent heat resistance than the conductive polymer layer in which an anion of the surfactant with a bulky sulfonic acid group or sulfonic acid salt group is contained as a dopant. From this result, it was found that the electrode body for a solar cell of the present invention is suitable as a positive electrode in a dye-sensitized solar cell.

(2) Influence of a Substrate (a) Manufacture of an Electrode Body for a Solar Cell

Example 6

A polymerization solution in which the total amount of EDOT was dissolved in water was obtained by introducing 50 μL of distilled water into a glass container, adding to this 0.35 g (concentration: 0.05 M) of p-nitrophenol, 0.125 g (concentration: 0.018 M) of EDOT, and 1.4 g (concentration: 0.08 M) of ammonium borodisalicylate in this order, and stirring it. An ITO electrode with an area of 1 cm$^2$ as a working electrode and a SUS mesh with an area of 5 cm$^2$ as a counter electrode were introduced, and galvanostatic electrolytic polymerization was carried out for 2 minutes under the condition of 100 μA/cm$^2$. After the working electrode after polymerization was washed by methanol, it was dried for 30 minutes at 150 degrees centigrade, and an electrode body was obtained in which a conductive polymer layer was formed on the ITO electrode.

Example 7

A polymerization solution in which the total amount of EDOT was dissolved in water was obtained by introducing 50 mL of distilled water into a glass container, adding to this 0.35 g (concentration: 0.05 M) of p-nitrophenol, 0.125 g (concentration: 0.018 M) of EDOT, and 1.4 g (concentration: 0.08 M) of ammonium borodisalicylate in this order, and stirring it A Ti electrode with an area of 2.25 cm$^2$ consisting of Ti foil with the thickness of 100 μm as a working electrode and a SUS mesh with an area of 5 cm$^2$ as a counter electrode were introduced, and galvanostatic electrolytic polymerization was carried out for 2 minutes under the condition of 100 μA/cm$^2$. After the working electrode after polymerization was washed by methanol, it was dried for 30 minutes at 150 degrees centigrade, and an electrode body was obtained in which a conductive polymer layer was formed on the Ti electrode.

Example 8

A polymerization solution in which the total amount of EDOT was dissolved in water was obtained by introducing 50 mL of distilled water into a glass container, adding to this 0.35 g (concentration: 0.05 M) of p-nitrophenol, 0.125 g (concentration: 0.018 M) of EDOT, and 1.4 g (concentration: 0.08 M) of ammonium borodisalicylate in this order, and stirring it. A SUS electrode with an area of 2.25 cm$^2$ composed of SUS 304 foil with the thickness of 100 μm as a working electrode and a SUS mesh with an area of 5 cm$^2$ as a counter electrode were introduced, and galvanostatic electrolytic polymerization was carried out for 2 minutes under the condition of 100 μA/cm$^2$. After the working electrode after polymerization was washed by methanol, it was dried for 30 minutes at 150 degrees centigrade, and an electrode body was obtained in which a conductive polymer layer was formed on the SUS electrode.

Example 9

1000 mL of distilled water was introduced into a glass container and 11.1 g (concentration: 0.08 M) of p-nitrophenol was added to and dissolved in this liquid. Then, 2.5 g (concentration: 0.018 M) of EDOT was added to the solution obtained, and the solution was left in an ultrasonic bath (output: 100 W/cm$^2$, frequency: 38 kHz) for 30 minutes. Further, 28.0 g (concentration: 0.08 M) of ammonium borodisalicylate was added to the solution obtained and stirred, and a polymerization solution in which a total amount of EDOT was dissolved was obtained. A Ti electrode with an area of 95 mm×100 mm composed of a Ti foil with a thickness of 100 μm as a working electrode and a SUS mesh with an area of 100 cm$^2$ as a counter electrode were introduced, and galvanostatic electrolytic polymerization was carried out for 6 minutes under the condition of 100 μA/cm$^2$. After the working electrode after polymerization was washed by methanol, it was dried for 30 minutes at 150 degrees centigrade, and an electrode body was obtained in which a conductive polymer layer was formed on the Ti electrode.

Comparative Example 7

225 μL of commercially available aqueous PEDOT: PSS dispersion (trade name: Baytron P, manufactured by H. C. Starck) was cast on a Ti electrode with an area of 2.25 cm$^2$ composed of a Ti foil with a thickness of 100 μm, and spin coating was carried out for 30 seconds at the rotation frequency of 5000 rpm. Then, it was dried at 150 degrees centigrade for 30 minutes and an electrode body in which a conductive polymer layer was formed on the Ti electrode was obtained.

Comparative Example 8

On a Ti electrode with an area of 2.25 cm$^2$ composed of a Ti foil with a thickness of 100 μm, Pt was evaporated by the sputtering method so that the thickness of Pt became approximately 100 nm, and an electrode body in which a Pt layer was formed on the Ti electrode was obtained.

(b) Evaluation of Electrochemical Response in I$^-$/I$_3^-$ Electrolyte

The electrochemical response in I$^-$/I$_3^-$ electrolyte of the electrode bodies in Examples 6 to 9 and Comparative Examples 7 and 8 was evaluated with cyclic voltammograms.

In an electrolyte where 10 mM of lithium iodide, 1 mM of iodine, and 1 M of lithium tetrafluoroborate were dissolved in acetonitrile, any one of the electrode bodies of Examples 6 to 8 and Comparative Examples 7 and 8 as a working electrode, a platinum mesh as a counter electrode with an area of 4 cm$^2$, and a silver-silver chloride electrode as a reference electrode were introduced, and the cyclic voltammogram was evaluated with the scanning potential range of −0.8 to +0.8 V.

Figure 12:
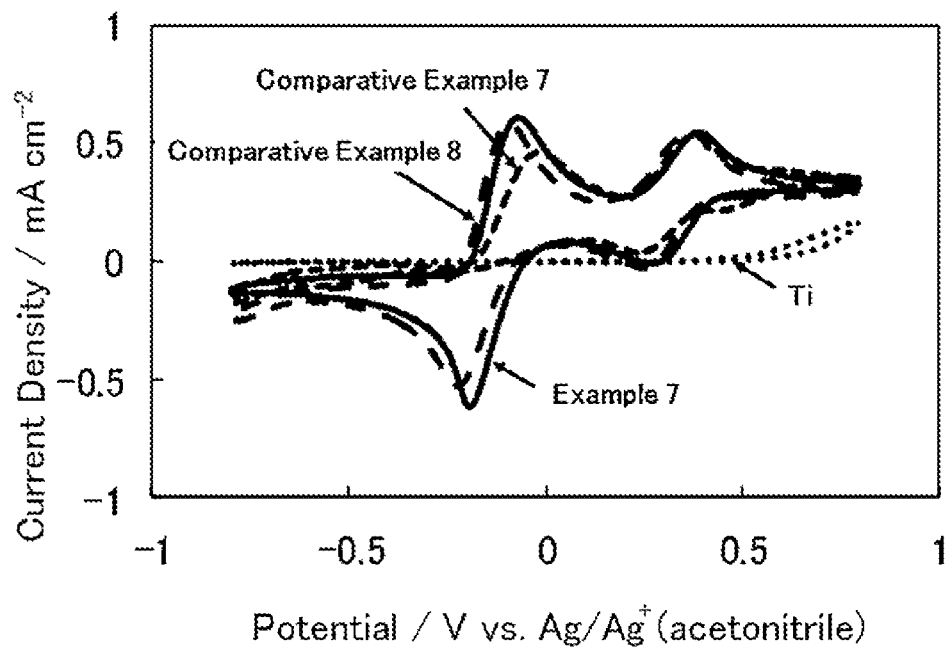
In FIG. 12, a cyclic voltammogram in an electrolyte, which contains an $I^-/I_3^-$ redox pair, of an electrode body obtained from a polymerization solution containing ammonium borodisalicylate and EDOT is compared with a cyclic voltammogram of an electrode body obtained from a slurry containing PEDOT:PSS and a cyclic voltammogram of a Pt-evaporated electrode body.

For the electrode bodies of Example 7 (dopant: borodisalicylate anion), Comparative Example 7 (dopant: PSS anion) and Comparative Example 8 (catalyst layer: Pt), cyclic voltammograms obtained under the condition of a scanning rate of 10 mV/s were compared with a cyclic voltammogram of a Ti electrode used as a substrate in manufacturing these electrode bodies. The results are shown in FIG. 12.

In the cyclic voltammogram of the Ti electrode, a clear oxidation-reduction wave was not found. In the cyclic voltammogram of the electrode body in Comparative Example 7, as with the report of Non-Patent Document 2, no reduction wave from I$_3^-$ to I$^-$ was found. In contrast, in the cyclic voltammograms of the electrode body of Example 7 and the electrode body of Comparative Example 8, two pairs of oxidation-reduction waves were clearly found. Therefore, it was found that the electrode body of Example 7 has excellent catalytic activity to convert I$_3^-$ to I$^-$ compared with the electrode body of Comparative Example 7 with a PEDOT:PSS layer, which was conventionally considered as a positive electrode of a dye-sensitized solar cell, and is an electrode body which can be a substitute for a Pt electrode for a dye-sensitized solar cell.

Figure 13:
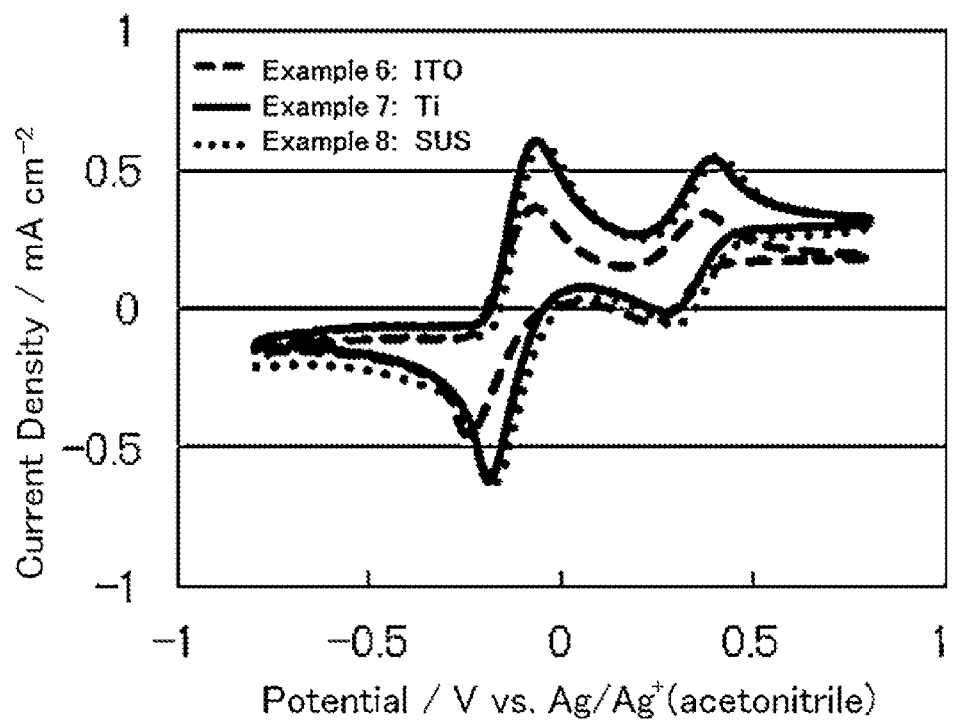
In FIG. 13, cyclic voltammograms in an electrolyte, which contains an $I^-/I_3^-$ redox pair, of an electrode body in which a conductive polymer layer is formed on a conductor composed of ITO, Ti or SUS 304 are compared.

FIG. 13 shows the cyclic voltammograms obtained under the condition of a scanning rate of 10 mV/s for the electrode bodies of Example 6 (substrate: ITO electrode), Example 7 (substrate: Ti electrode) and Example 8 (substrate: SUS electrode). For all electrode bodies, two pairs of oxidation-reduction waves were clearly found. It is considered that the electrode bodies of Examples 7 and 8 show a bigger oxidation-reduction current than the electrode body of Example 6 because the asperity of the surface of the Ti electrode and the SUS electrode is greater than the asperity of the surface of the ITO electrode, and therefore, the effective surface area of the electrodes is larger.

Figure 14:
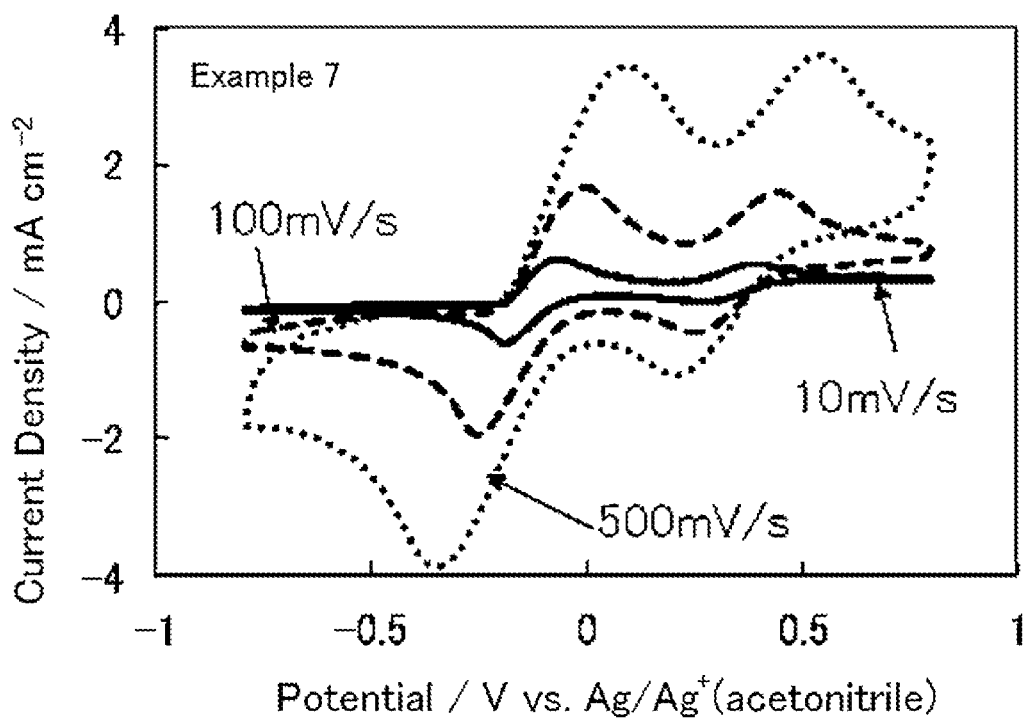
FIG. 14 shows the results of measuring at different scanning rates a cyclic voltammogram in an electrolyte, which contains an $I^-/I_3^-$ redox pair, of an electrode body obtained from a polymerization solution containing ammonium borodisalicylate and EDOT.

For the electrode body of Example 7 (substrate: Ti electrode, dopant: borodisalicylate anion), the cyclic voltammogram was evaluated by changing the scanning rate within the range of 10 to 500 mV/s. FIG. 14 summarizes the cyclic voltammograms obtained under the condition of the scanning rate 10 mV/s, 100 mV/s and 500 mV/s. Even when the scanning rate was accelerated, two pairs of oxidation-reduction waves were clearly shown, and the reduction wave from I$_3^-$ to I$^-$ found at −0.2 V against the silver-silver chloride electrode, which is especially important in a dye-sensitized solar cell, was clearly shown. Therefore, it was found that a sufficient reduction speed and reduction in the quantity of I$_3^-$ was also obtained at a high scanning rate and sufficient reproduction of I$^-$ ions was brought about. This result shows that when the electrode body in Example 7 is used as a positive electrode and it is combined with a negative electrode with a semiconductor layer containing a pigment as a photosensitizer to comprise a dye-sensitized solar cell, the quick generation of electricity can be expected by combining the electrode body in Example 7 with a negative electrode with high photoelectron transfer reaction.

Figure 15:
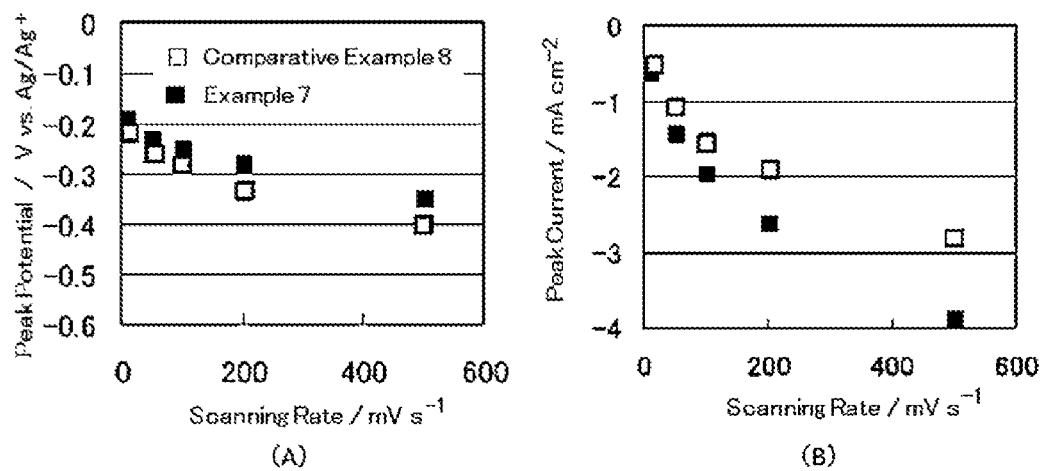
FIG. 15 shows the results of measuring at different scanning rates a cyclic voltammogram in an electrolyte, which contains an $I^-/I_3^-$ redox pair, of an electrode body obtained from a polymerization solution containing ammonium borodisalicylate and EDOT and and a Pt-evaporated electrode body; (A) shows the relationship between the peak potential in a reduction wave from $I_3^-$ to $I^-$ and the scanning rate, and (B) shows the relationship between the peak current in a reduction wave from $I_3^-$ to $I^-$ and the scanning rate.

For the electrode body of Example 7 (substrate: Ti electrode, dopant: borodisalicylate anion) and the electrode body of Comparative Example 8 (catalyst layer: Pt), cyclic voltammograms were evaluated under the condition of a scanning rate of 10 to 500 mV/s, and the relationship between the peak potential/peak current in a reduction wave from I$_3^-$ to I$^-$ and the scanning rate was compared. FIG. 15 (A) shows the relationship between the peak potential in a reduction wave from I$_3^-$ to I$^-$ and the scanning rate and FIG. 15 (B) shows the relationship between the peak current in a reduction wave from I$_3^-$ to I$^-$ and the scanning rate. As can be seen from FIG. 15 (A), in the electrode body of Example 7, compared with the electrode body in Comparative Example 8, the peak potential was shifted to the positive potential side, and the difference between the two became larger as the scanning rate became quicker. This means that the reduction speed of I$_3^-$ for the electrode body of Example 7 is higher than the reduction speed of I$_3^-$ for the electrode body of Comparative Example 8, and the difference became more remarkable as the scanning rate was quicker. Also, as is understood from FIG. 15 (B), the electrode body in Example 7, compared with the electrode body in Comparative Example 8, had a large peak current, and the difference became larger as the scanning rate became quicker. This means that the reduction quantity of $I_3^-$ in the electrode body of Example 7 is larger than the reduction quantity of $I_3^-$ in the electrode body of Comparative Example 8, and the difference becomes more remarkable as the scanning rate is quicker. This result shows that an improvement in the photoelectric conversion efficiency of a dye-sensitized solar cell can be expected by using an electrode body of Example 7, which brings about sufficient reproduction of $I^-$, instead of a Pt electrode of a dye-sensitized solar cell.

Figure 16:
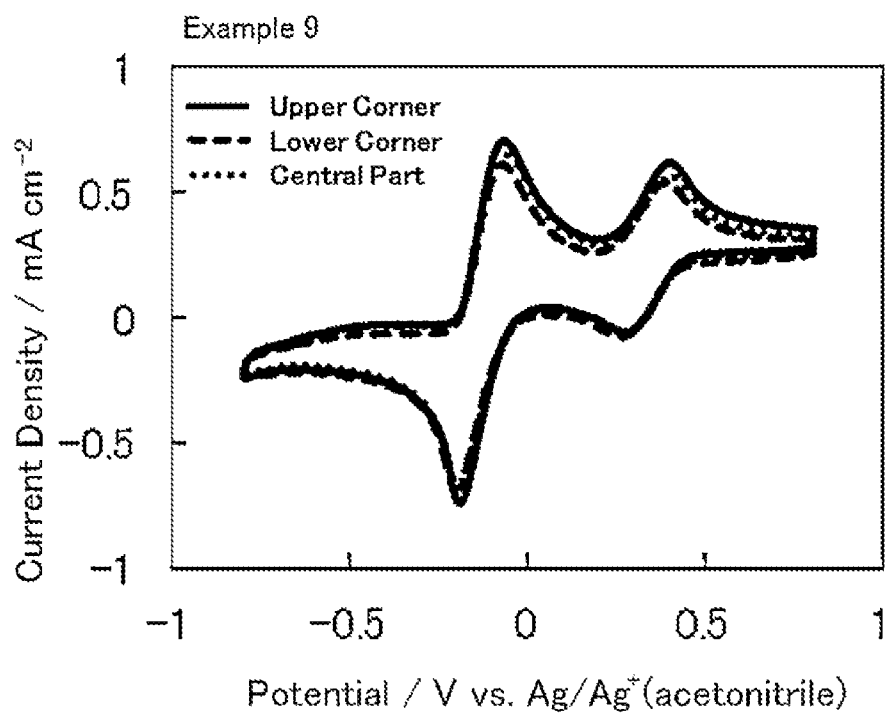
FIG. 16 shows the results of an experiment in which an upper corner, a lower corner, and a central part are cut off from an electrode body with a large-area substrate on which a conductive polymer layer is formed, and a cyclic voltammogram of each part in an electrolyte containing an $I^-/I_3^-$ redox pair is compared with the other parts.
Figure 17:
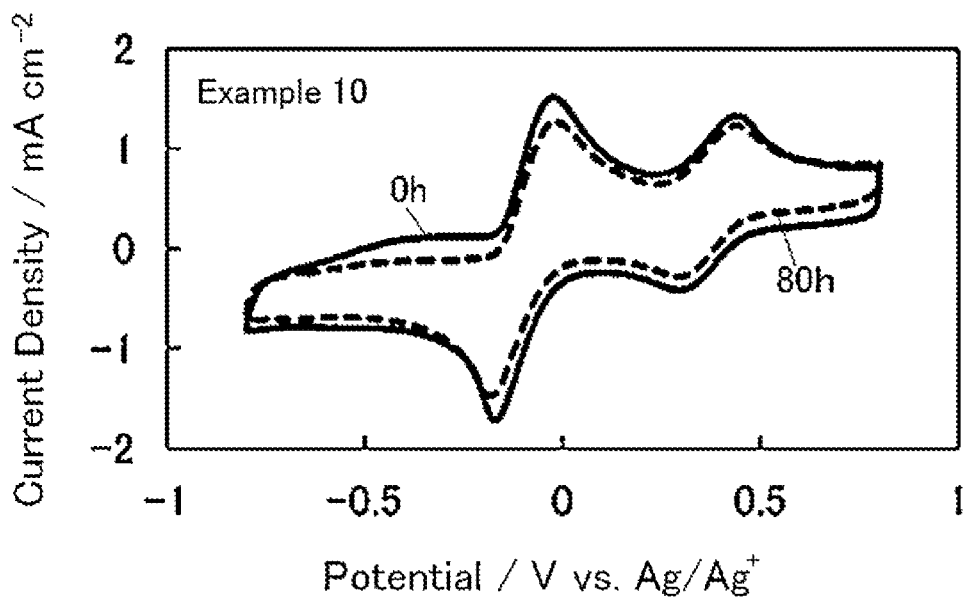
FIG. 17 shows a cyclic voltammogram in an electrolyte, which contains an $I^-/I_3^-$ redox pair, of an electrode body obtained from a polymerization solution using a water-rich solvent in which the water content is 100% by mass.
Figure 18:
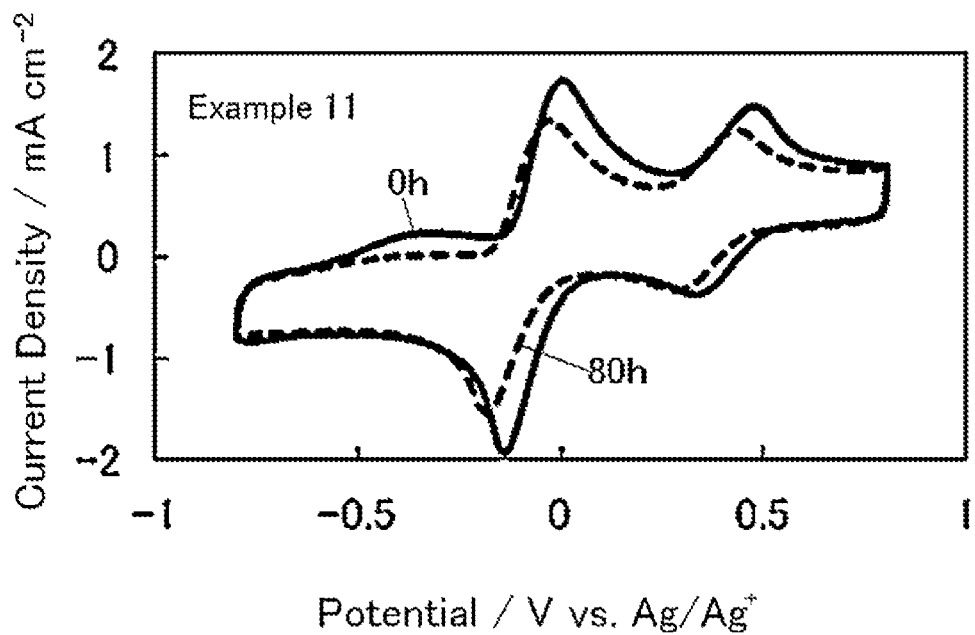
FIG. 18 shows a cyclic voltammogram in an electrolyte, which contains an $I^-/I_3^-$ redox pair, of an electrode body obtained from a polymerization solution using a water-rich solvent in which the water content is 90% by mass.
Figure 19:
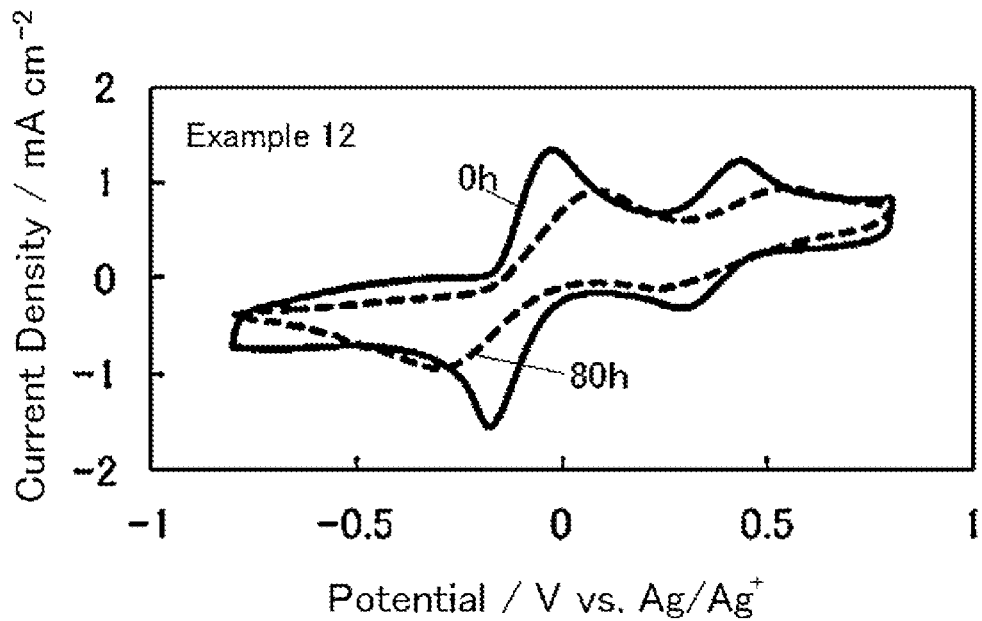
FIG. 19 shows a cyclic voltammogram in an electrolyte, which contains an $I^-/I_3^-$ redox pair, of an electrode body obtained from a polymerization solution using a water-rich solvent in which the water content is 80% by mass.
Figure 20:
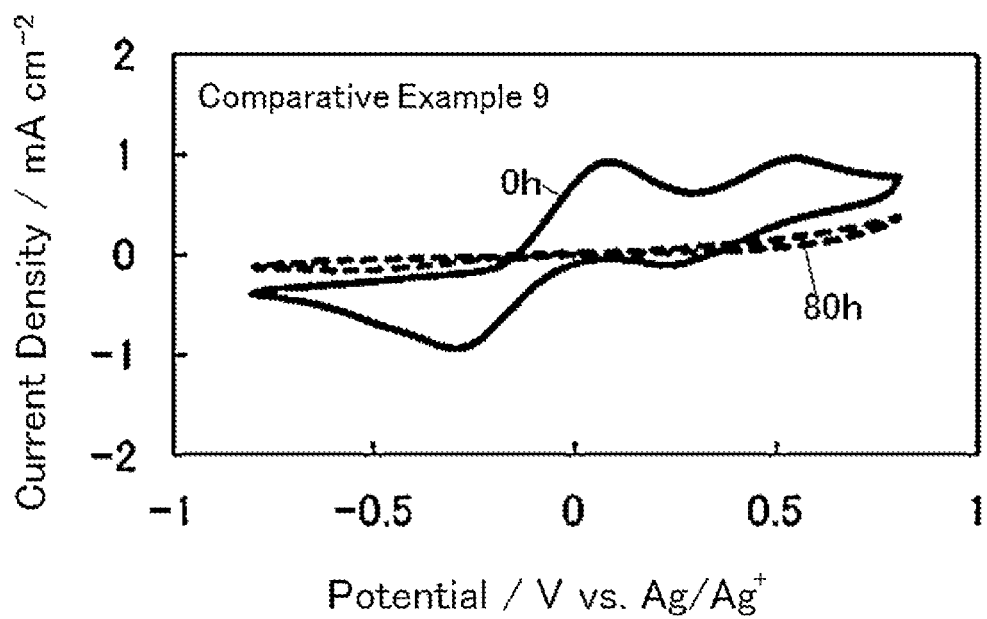
FIG. 20 shows a cyclic voltammogram in an electrolyte, which contains an $I^-/I_3^-$ redox pair, of an electrode body obtained from a polymerization solution using a water-rich solvent in which the water content is 67% by mass.

In the electrode body of Example 9 (substrate: Ti electrode, dopant: borodisalicylate anion), a conductive polymer layer is formed on a substrate with an area of 95 mm×100 mm. To confirm that an even conductive polymer layer is obtained by electrolytic polymerization even if a substrate with such a large area is used, from the electrode body of Example 9, the upper corner part which was located at the upper edge of the right corner of the substrate at the time of electrolytic polymerization, the lower corner part which was located at the lower edge of the right corner of the substrate at the time of electrolytic polymerization, and the central part which was located at the center of the substrate at the time of electrolytic polymerization were each cut to a size of 15 mm×15 mm, and cyclic voltammograms of each part were compared. As can be seen from FIG. 16, the cyclic voltammograms of each part were almost the same, and it was found that an even conductive polymer layer was formed.

(3) Effect of the Density of a Conductive Polymer Layer
(a) Manufacture of an Electrode Body for a Solar Cell Example 10

A polymerization solution in which the total amount of EDOT was dissolved in water was obtained by introducing 50 mL of distilled water into a glass container, adding to this 0.35 g (concentration: 0.05 M) of p-nitrophenol, 0.105 g (concentration: 0.0148 M) of EDOT, and 1.4 g (concentration: 0.08 M) of ammonium borodisalicylate in this order, and stirring it. A Ti electrode with an area of 2.25 cm² consisting of Ti foil with the thickness of 100 μm as a working electrode and a SUS mesh with an area of 5 cm² as a counter electrode were introduced, and galvanostatic electrolytic polymerization was carried out for five minutes under the condition of 500 μA/cm². After the working electrode after polymerization was washed by methanol, it was dried for 30 minutes at 150 degrees centigrade, and an electrode body was obtained in which a conductive polymer layer was formed on the Ti electrode. Attempts were made to measure thickness of the conductive polymer layer on the Ti electrode, but the exact thickness could not be measured due to the asperity of the surface of the Ti electrode. Then, as a substitute method, electrolytic polymerization was carried out with an ITO electrode with a flat surface under the same conditions, and by measuring the difference on the surface between the forming part of a conductive polymer layer and the non-forming part of a conductive polymer (the surface of the ITO electrode) with an atomic force microscope, the thickness of the conductive polymer layer was calculated. Then, the density of the conductive polymer layer was calculated from the thickness of the conductive polymer layer, the Ti electrode area and the weight. As a result, the density was calculated as 1.60 g/cm³.

Example 11

The procedure of Example 10 was repeated by using a mixed solvent of 45 mL of distilled water and 5 mL of ethanol instead of 50 mL of distilled water. The density of the conductive polymer layer was 1.20 g/cm³.

Example 12

The procedure of Example 10 was repeated by using a mixed solvent of 40 mL of distilled water and 10 mL of ethanol instead of 50 mL of distilled water. The density of the conductive polymer layer was 1.15 g/cm³.

Comparative Example 9

The procedure of Example 10 was repeated by using a mixed solvent with 33.5 mL of distilled water and 16.5 mL of ethanol instead of 50 mL of distilled water. The density of the conductive polymer layer was 1.10 g/cm³.

(b) Evaluation of Electrochemical Response in an $I^-/I_3^-$ electrolyte

The electrochemical response in an $I^-/I_3^-$ electrolyte of the electrode bodies in Examples 10 to 12 and Comparative Example 9 was evaluated with cyclic voltammograms.

In an electrolyte where 10 mM of lithium iodide, 1 mM of iodine, and 1 M of lithium tetrafluoroborate were dissolved in acetonitrile, any one of the electrode bodies of Examples 10 to 12 and Comparative Example 9 as a working electrode, a platinum mesh as a counter electrode with an area of 4 cm², and a silver-silver chloride electrode as a reference electrode were introduced, and the cyclic voltammogram was evaluated with the scanning potential in the range of −0.8 to +0.8 V.

Then, the electrode bodies of Examples 10 to 12 and Comparative Example 9 were taken out of the electrolyte, and after washing, thermal aging was carried out for 80 hours at 170 degrees centigrade in the atmosphere, and cyclic voltammograms were obtained again.

FIGS. 17 to 20 show the cyclic voltammograms before and after thermal aging. FIG. 17, FIG. 18, FIG. 19 and FIG. 20, in this order, show cyclic voltammograms of the electrode bodies of Example 10 (solvent: 100%-water solvent, polymer layer: density 1.60 g/cm³), Example 11 (solvent: 90%-water solvent, polymer layer: density 1.20 g/cm³), Example 12 (solvent: 80%-water solvent, polymer layer: density 1.15 g/cm³), and Comparative Example 9 (solvent: 67%-water solvent, polymer layer: density 1.10 g/cm³).

In the early stage, for all the electrode bodies of Examples 10 to 12 and Comparative Example 9, two pairs of oxidation-reduction waves were clearly found, and a reduction wave from $I_3^-$ to $I^-$, which is especially important in a dye-sensitized solar cell, was clearly found. However, after thermal aging, two pairs of oxidation-reduction waves were found in the cyclic voltammograms of Examples 10 to 12, but as the density of the conductive polymer layer decreased, or the amount of ethanol contained in a water-rich solvent of the polymerization solution was increased, the degree of deterioration due to heat experience increased. In the cyclic voltammogram of the electrode body in Comparative Example 9, the two pairs of oxidation-reduction waves were not found. Therefore, it was found that, to gain an electrode body with a reduction catalytic activity to change an oxidizing species ($I_3^-$) into a reducing species ($I^-$) after high temperature experience, it is important to make the density of the conductive polymer layer 1.15 g/cm³ or more.

(4) Influence of Thickness of the Conductive Polymer Layer
(a) Manufacture of an Electrode Body for a Solar Cell Example 13

A polymerization solution in which the total amount of EDOT was dissolved in water was obtained by introducing 50 mL of distilled water into a glass container, adding to this 0.35 g (concentration: 0.05 M) of p-nitrophenol, 0.125 g (concentration: 0.018 M) of EDOT, and 1.4 g (concentration: 0.08 M) of ammonium borodisalicylate in this order, and stirring it. A Ti electrode with an area of 2.25 cm² consisting of Ti foil with the thickness of 100 μm as a working electrode and a SUS mesh with an area of 5 cm² as a counter electrode were introduced, and galvanostatic electrolytic polymerization was carried out for 0.5 minutes under the condition of 100 μA/cm². After the working electrode after polymerization was washed by methanol, it was dried for 30 minutes at 150 degrees centigrade, and an electrode body was obtained in which a conductive polymer layer was formed on the Ti electrode.

Attempts were made to measure the thickness of the conductive polymer layer on the Ti electrode, but the exact thickness could not be measured due to the asperity of the surface of the Ti electrode. Then, as a substitute method, an electrolytic polymerization was carried out with an ITO electrode with a flat surface under the same conditions, and by measuring the difference on the surface between the forming part of a conductive polymer layer and the non-forming part of a conductive polymer (the surface of the ITO electrode) with an atomic force microscope, the thickness of the conductive polymer layer was calculated. As a result, the thickness was found to be about 18 nm.

Example 14

The procedure of Example 13 was repeated except that the polymerization time was extended to one minute. The thickness of the conductive polymer layer, which was calculated by the same alternative method as in Example 13, was about 35 nm.

Example 15

The procedure of Example 13 was repeated except that the polymerization time was extended to two minute. The thickness of the conductive polymer layer, which was calculated by the same alternative method as in Example 13, was about 70 nm.

Example 16

The procedure of Example 13 was repeated except that the polymerization time was extended to six minute. The thickness of the conductive polymer layer, which was calculated by the same alternative method as in Example 13, was about 210 nm.

Example 17

The procedure of Example 13 was repeated except that the polymerization time was extended to ten minute. The thickness of the conductive polymer layer, which was calculated by the same alternative method as in Example 13, was about 350 nm.

Example 18

The procedure of Example 13 was repeated except that the polymerization time was extended to 1 hour. The thickness of the conductive polymer layer, which was calculated by measuring the difference on the surface between the forming part of a conductive polymer layer and the non-forming part of a conductive polymer (the surface of the Ti electrode) with a laser displacement meter, was about 1800 nm.

(b) Evaluation of Electrochemical Response in an $I^-/I_3^-$ Electrolyte

The electrochemical response in an $I^-/I_3^-$ electrolyte of the electrode bodies in Examples 13 to 18 (substrate; Ti electrode, dopant: borodisalicylate anion) was evaluated with cyclic voltammograms.

Any one of the electrode bodies of Examples 13 to 18 as a working electrode, a platinum mesh as a counter electrode with an area of 4 cm², and a silver-silver chloride electrode as a reference electrode were introduced to an electrolyte in which 10 mM lithium iodide, 1 mM iodine, and 1 M lithium tetrafluoroborate were dissolved in acetonitrile, and the cyclic voltammogram was evaluated with the scanning potential range of −0.8 to +0.8 V, with the scanning rate changing from 10 to 500 mV/s.

Figure 21:
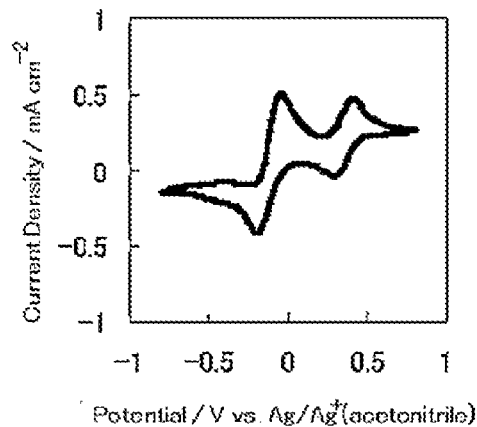
FIG. 21 shows the evaluation results of a cyclic voltammogram in an electrolyte, which contains an $I^-/I_3^-$ redox pair, of an electrode body with a conductive polymer layer with the thickness of about 18 nm; (A) shows a cyclic voltammogram obtained under the condition of the scanning rate of 10 mV/s and (B) shows the relationship between the peak potential in a reduction wave from $I_3^-$ to $I^-$ and the scanning rate.
Figure 21:
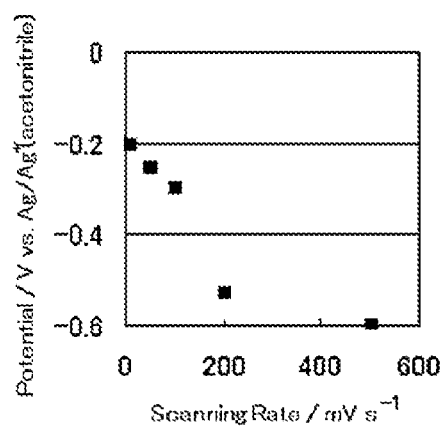
Figure 22:
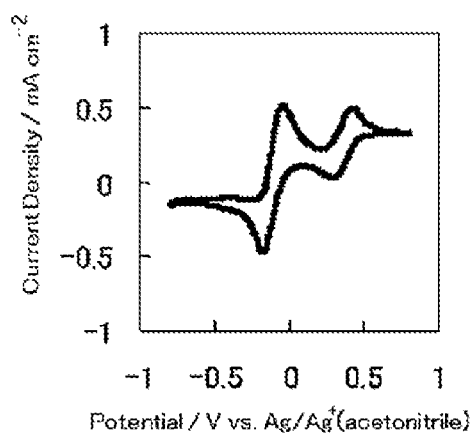
FIG. 22 shows the evaluation results of a cyclic voltammogram in an electrolyte, which contains an $I^-/I_3^-$ redox pair, of an electrode body with a conductive polymer layer with the thickness of about 35 nm; (A) shows a cyclic voltammogram obtained under the condition of the scanning rate of 10 mV/s and (B) shows the relationship between the peak potential in a reduction wave from $I_3^-$ to $I^-$ and the scanning rate.
Figure 22:
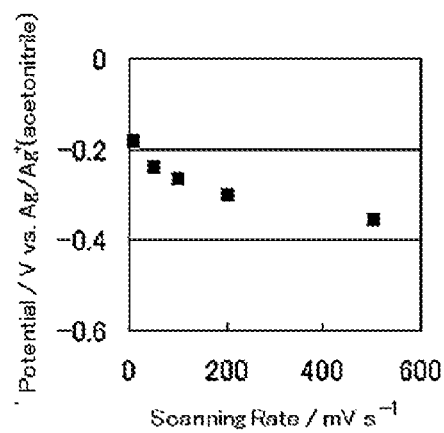
Figure 23:
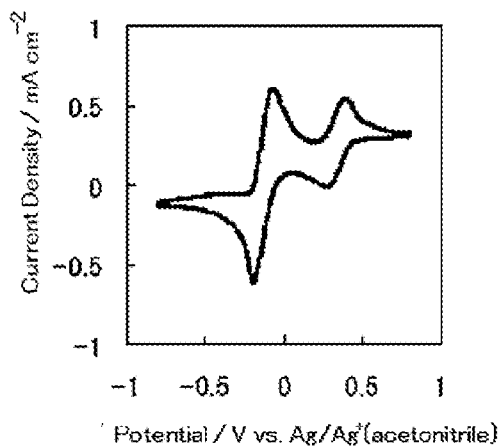
FIG. 23 shows the evaluation results of a cyclic voltammogram in an electrolyte, which contains an $I^-/I_3^-$ redox pair, of an electrode body with a conductive polymer layer with the thickness of about 70 nm; (A) shows a cyclic voltammogram obtained under the condition of the scanning rate of 10 mV/s and (B) shows the relationship between the peak potential in a reduction wave from $I_3^-$ to $I^-$ and the scanning rate.
Figure 23:
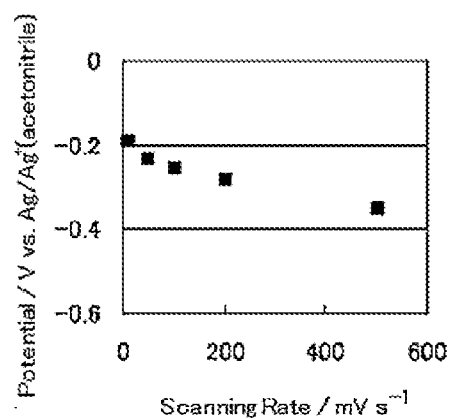
Figure 24:
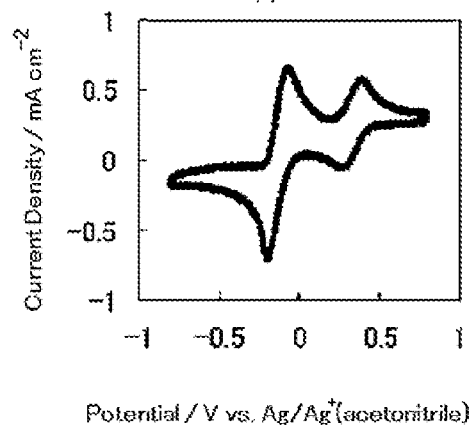
FIG. 24 shows the evaluation results of a cyclic voltammogram in an electrolyte, which contains an $I^-/I_3^-$ redox pair, of an electrode body with a conductive polymer layer with the thickness of about 210 nm; (A) shows a cyclic voltammogram obtained under the condition of the scanning rate of 10 mV/s and (B) shows the relationship between the peak potential in a reduction wave from $I_3^-$ to $I^-$ and the scanning rate.
Figure 24:
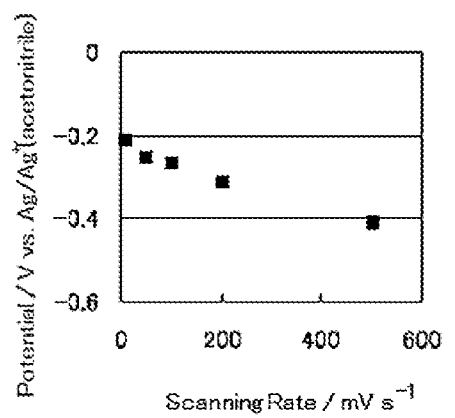
Figure 25:
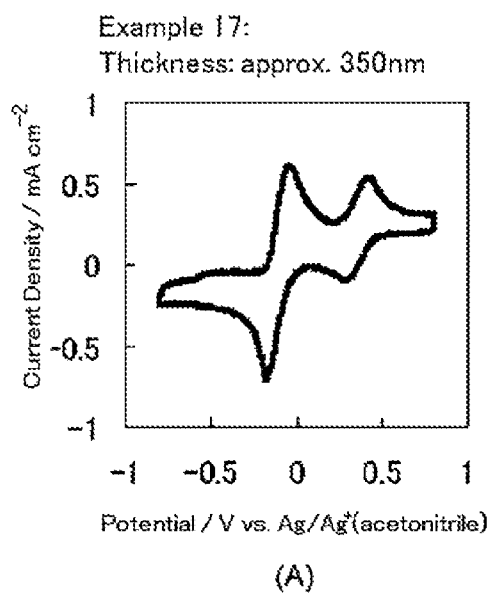
FIG. 25 shows the evaluation results of a cyclic voltammogram in an electrolyte, which contains an $I^-/I_3^-$ redox pair, of an electrode body with a conductive polymer layer with the thickness of about 350 nm; (A) shows a cyclic voltammogram obtained under the condition of the scanning rate of 10 mV/s and (B) shows the relationship between the peak potential in a reduction wave from $I_3^-$ to $I^-$ and the scanning rate.
Figure 25:
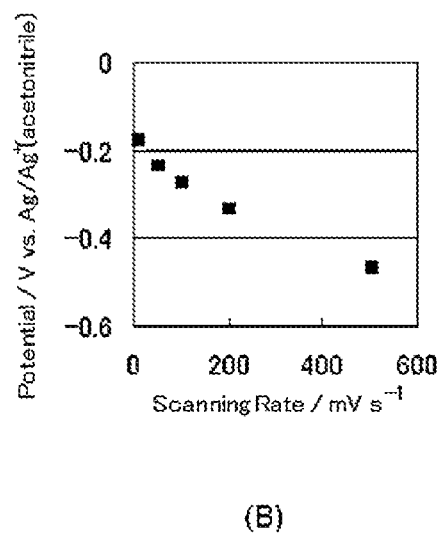
Figure 26:
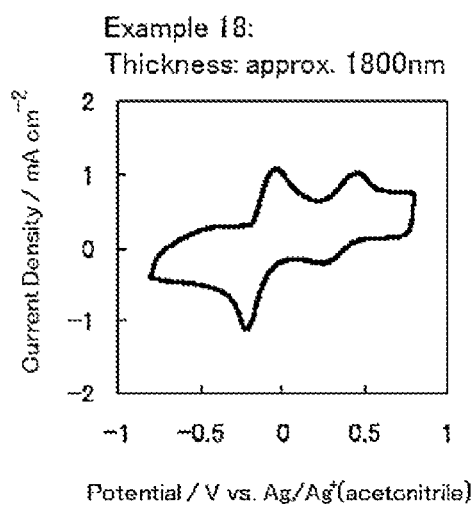
FIG. 26 shows the evaluation results of a cyclic voltammogram in an electrolyte, which contains an $I^-/I_3^-$ redox pair, of an electrode body with a conductive polymer layer with the thickness of about 1800 nm; (A) shows a cyclic voltammogram obtained under the condition of the scanning rate of 10 mV/s and (B) shows the relationship between the peak potential in a reduction wave from $I_3^-$ to $I^-$ and the scanning rate.
Figure 26:
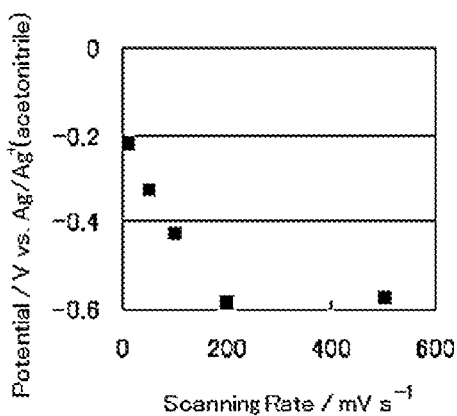

FIG. 21 shows the cyclic voltammogram result for the electrode body of Example 13 (thickness of the conductive polymer layer: about 18 nm), FIG. 22 shows the cyclic voltammogram result for the electrode body of Example 14 (thickness of the conductive polymer layer: about 35 nm), FIG. 23 shows the cyclic voltammogram result for the electrode body of Example 15 (thickness of the conductive polymer layer: about 70 nm), FIG. 24 shows the cyclic voltammogram result for the electrode body of Example 16 (thickness of the conductive polymer layer: about 210 nm), FIG. 25 shows the cyclic voltammogram result for the electrode body of Example 17 (thickness of the conductive polymer layer: about 350 nm), and FIG. 26 shows the cyclic voltammogram result for the electrode body of Example 18 (thickness of the conductive polymer layer: about 1800 nm). In each Figure, (A) shows a cyclic voltammogram obtained under the condition of the scanning rate of 10 mV/s and (B) shows the relationship between the peak potential in a reduction wave from $I_3^-$ to $I^-$ and the scanning rate.

As can be observed from (A) of FIGS. 21 to 26, for all the electrode bodies with a conductive polymer with a thickness of about 18 nm to 1800 nm, two pairs of oxidation-reduction waves are clearly shown, and a reduction wave from $I_3^-$ to $I^-$, which is especially important in a dye-sensitized solar cell, was clearly shown. Therefore, it was found that all these electrode bodies had excellent catalytic activity to convert $I_3^-$ to $I^-$, and were electrode bodies that could be a substitute for a Pt electrode for a dye-sensitized solar cell. However, the peak current in the reduction wave from $I_3^-$ to $I^-$ became smaller as the thickness of the conductive polymer layer in the electrode body became smaller and especially, the electrode of Example 13 with a conductive polymer layer with the thickness of about 18 nm and the electrode of Example 14 with a conductive polymer layer with the thickness of about 35 nm showed, compared with the electrode of Example 15 with a conductive polymer layer with the thickness of about 70 nm, a remarkable decrease in the peak current. An increase in the peak current leads to a larger short circuit current value of a solar cell if a dye-sensitized solar cell is composed with these electrodes.

Also, as can be seen from (B) of FIGS. 21 to 26, in all the electrode bodies with a conductive polymer with a thickness in the range of about 18 nm to 1800 nm, a reduction wave from $I_3^-$ to $I^-$, which is especially important in a dye-sensitized solar cell, was found at around −0.2 V against the silver-silver chloride electrode under the condition of the scanning rate of 10 mV/s. However, the peak potential in the reduction wave from $I_3^-$ to $I^-$ was shifted to the negative potential side as the scanning rate increased, and the electrode body of Example 13 with a conductive polymer layer with thickness of about 18 nm and the electrode body of Example 18 with a conductive polymer layer with thickness of about 1800 nm showed a remarkable shift compared with other electrodes. The shift of the peak voltage leads to a smaller open voltage of a solar cell if a dye-sensitized solar cell is composed with these electrode bodies.

As the conversion efficiency of the solar cell is proportionate to the product of the short circuit current and the open voltage, it was concluded from the FIGS. 21 to 26 that the thickness of the conductive polymer layer is preferably in the range of 35 to 350 nm, and especially preferably 70 to 350 nm in the case the electrode body obtained by the method of the present invention is used as a component of a dye-sensitized solar cell.

(5) Evaluation as a Dye-Sensitized Solar Cell

Example 19

A solution in which the total amount of EDOT was dissolved in water was obtained by introducing 50 mL of distilled water into a glass container, adding to this 0.105 g (concentration of 0.0148 M) of EDOT and stirring it at 25 degrees centigrade for 60 minutes. Then, p-nitrophenol at the concentration of 0.02 M and ammonium borodisalicylate at the concentration of 0.08 M were dissolved into this solution, and a polymerization solution was obtained.

A FTO electrode as a working electrode with an area of 1 cm$^2$, a platinum mesh as a counter electrode with an area of 4 cm$^2$, and a silver-silver chloride electrode as a reference electrode were introduced to the obtained polymerization solution, and galvanostatic electrolytic polymerization was performed for 60 seconds under a current condition of 10 μA/cm$^2$. The working electrode after electrolytic polymerization was washed with methanol, and then dried at 150 degrees centigrade for 30 minutes, and an electrode body on which a conductive polymer layer was formed on the FTO electrode (positive electrode) was obtained.

Titanium oxide paste (manufacturer: JGC Catalysts and Chemicals Ltd.) was applied to the surface of an ITO electrode by bar coat method so that the thickness of the layer would be about 100 μm, was dried preliminarily for 10 minutes at 130 degrees centigrade, and then burned for 30 minutes at 450 degrees centigrade so that a titanium oxide porous layer was formed on the ITO electrode. Further, by immersing the titanium oxide porous layer for 3 hours in an ethanol solution containing pigment N719 at the concentration of 0.2 mM and drying it at a room temperature, the titanium oxide porous layer was impregnated with the pigment N719, and a negative electrode of a dye-sensitized solar cell was obtained.

Then, by bonding together the negative electrode and positive electrode so that the titanium oxide porous layer and the conductive polymer layer faced each other, and impregnating an electrolyte into the gap, an electrolyte layer was formed. For the electrolyte, a solution in which 0.5 M lithium iodide, 0.05 M iodine, and 0.5 M 4-t-butylpyridine were dissolved in acetonitrile was used. Lastly, a seal was made with epoxy resin, and a dye-sensitized solar cell was obtained.

Comparative Example 10

By bonding together the negative electrode obtained in Example 19 and a positive electrode composed of a Pt electrode in which a Pt layer with the area of 1 cm$^2$ was placed by a sputtering method on a steel substrate so that the titanium oxide porous layer and the Pt layer faced each other, and by impregnating an electrolyte into the gap, an electrolyte layer was formed. For the electrolyte, a solution in which 0.5 M lithium iodide, 0.05 M iodine, and 0.5 M 4-t-butylpyridine were dissolved in acetonitrile was used. Lastly, a seal was made with epoxy resin, and a dye-sensitized solar cell was obtained.

For the dye-sensitized solar cells in Example 19 and Comparative Example 10, current-voltage characteristics under the irradiation condition of 100 mW/cm$^2$ and AM 1.5 G by a solar simulator were evaluated. Evaluation was made at 20 degrees centigrade with the voltage changing at the speed of 50 mV/s. Table 1 summarizes the short circuit current, open voltage, fill factor and photoelectric conversion efficiency obtained. Though inferior to the photoelectric conversion efficiency of the solar cell in Comparative Example 10 in which a conventional Pt electrode is used as a positive electrode, the photoelectric conversion efficiency more than 80% of that of the solar cell of Comparative Example 10 was also obtained in the solar cell of Example 19.

TABLE 1

| | Short Circuit Current mA | Open Voltage V | Fill Factor % | Conversion Efficiency % |
|---|---|---|---|---|
| Example 19 | 8.73 | 0.65 | 0.41 | 2.25 |
| Comparative Example 10 | 9.16 | 0.63 | 0.47 | 2.70 |

INDUSTRIAL APPLICABILITY

The present invention gives an electrode body for a solar cell that is suitable for use as a component of both an organic thin film solar cell and a dye-sensitized solar cell.

What is claimed is:

1. An electrode body for a solar cell comprising a substrate with a conductive part at least on the surface and a conductive polymer layer located on the conductive part of the substrate, wherein the conductive polymer layer comprises:
   a polymer derived from at least one monomer selected from the group consisting of 3,4-disubstituted thiophenes; and
   an anion as a dopant to the polymer generated from at least one organic non-sulfonate compound having an anion with the molecular weight of 200 or more, and the density of the conductive polymer layer is within the range of 1.15 to 1.80 g/cm$^3$.

2. The electrode body for a solar cell according to claim 1, wherein the density of the conductive polymer layer is within the range of 1.60 to 1.80 g/cm$^3$.

3. The electrode body for a solar cell according to claim 1, wherein the thickness of the conductive polymer layer is within the range of 1 to 2000 nm.

4. The electrode body for a solar cell according to claim 1, wherein the organic non-sulfonate compound is at least one compound selected from the group consisting of borodisalicylic acid and borodisalicylic salts.

5. The electrode body for a solar cell according to claim 1, wherein the organic non-sulfonate compound is at least one compound selected from the group consisting of a sulfonylimidic acid of the formula (I) or the formula (II)

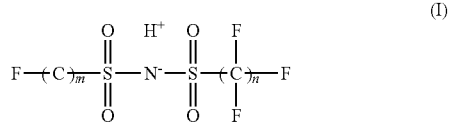

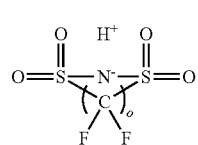

(II)

where m is an integer from 1 to 8, n is an integer from 1 to 8, and o is an integer 2 or 3, and salts thereof.

6. The electrode body for a solar cell according to claim 1, wherein the organic non-sulfonate compound is a salt of bis(pentafluoroethanesulfonyl)imidic acid.

7. The electrode body for a solar cell according to claim 1 wherein the monomer is 3,4-ethylenedioxythiophene.

8. The electrode body for a solar cell according to claim 1, wherein the substrate is transparent.

9. A method for producing the electrode body for a solar cell according to claim 1, comprising:
a preparation process of obtaining a polymerization solution comprising: a solvent consisting of 100 to 80% by mass of water and 0 to 20% by mass of an organic solvent; at least one monomer selected from the group consisting of 3,4-disubstituted thiophenes; and at least one organic non-sulfonate compound having an anion with the molecular weight of 200 or more; and
a polymerization process of introducing a substrate with a conductive part at least on the surface to the polymerization solution and performing electrolytic polymerization to form a conductive polymer layer by polymerization of the monomer on the conductive part of the substrate.

10. The method for producing the electrode body for a solar cell according to claim 9, wherein the solvent consists only of water.

11. The method for producing the electrode body for a solar cell according to claim 9, wherein the organic non-sulfonate compound is at least one compound selected from the group consisting of borodisalicylic acid and borodisalicylic salts, and the polymerization solution further comprising at least one stabilizer selected from the group consisting of nitrobenzene and nitrobenzene derivatives is prepared in the preparation process.

12. The method for producing the electrode body for a solar cell according to claim 9, wherein an ultrasonic wave is irradiated into a solution containing the monomer in more than the saturated solution amount in the preparation process to obtain the polymerization solution in which the monomer is dispersed as oil drops.

13. An organic thin-film solar cell comprising:
a positive electrode with a conductive part at least on the surface;
a hole extraction layer located on the conductive part of the positive electrode;
a photoelectric conversion layer located on the hole extraction layer having a hole transporter and an electron transporter; and
a negative electrode located on the photoelectric conversion layer, wherein the positive electrode and the hole extraction layer are composed of the electrode body for a solar cell according to claim 1.

14. A dye-sensitized solar cell comprising:
a negative electrode having a semiconductor layer with a pigment as a photosensitizer;
an electrolyte layer located on the semiconductor layer of the negative electrode having paired oxidized species and reduced species; and
a positive electrode located on the electrolyte layer having a conductive polymer layer that acts as a catalyst to convert the oxidized species into the reduced species, wherein the positive electrode is composed of the electrode body for a solar cell according to claim 1.

15. An organic thin-film solar cell comprising:
a positive electrode with a conductive part at least on the surface;
a hole extraction layer located on the conductive part of the positive electrode;
a photoelectric conversion layer located on the hole extraction layer having a hole transporter and an electron transporter; and
a negative electrode located on the photoelectric conversion layer, wherein the positive electrode and the hole extraction layer are composed of the electrode body for a solar cell according to claim 3.

16. A dye-sensitized solar cell comprising:
a negative electrode having a semiconductor layer with a pigment as a photosensitizer;
an electrolyte layer located on the semiconductor layer of the negative electrode having paired oxidized species and reduced species; and
a positive electrode located on the electrolyte layer having a conductive polymer layer that acts as a catalyst to convert the oxidized species into the reduced species, wherein the positive electrode is composed of the electrode body for a solar cell according to claim 3.

17. An organic thin-film solar cell comprising:
a positive electrode with a conductive part at least on the surface;
a hole extraction layer located on the conductive part of the positive electrode;
a photoelectric conversion layer located on the hole extraction layer having a hole transporter and an electron transporter; and
a negative electrode located on the photoelectric conversion layer, wherein the positive electrode and the hole extraction layer are composed of the electrode body for a solar cell according to claim 4.

18. A dye-sensitized solar cell comprising:
a negative electrode having a semiconductor layer with a pigment as a photosensitizer;
an electrolyte layer located on the semiconductor layer of the negative electrode having paired oxidized species and reduced species; and
a positive electrode located on the electrolyte layer having a conductive polymer layer that acts as a catalyst to convert the oxidized species into the reduced species, wherein the positive electrode is composed of the electrode body for a solar cell according to claim 4.

19. An organic thin-film solar cell comprising:
a positive electrode with a conductive part at least on the surface;
a hole extraction layer located on the conductive part of the positive electrode;
a photoelectric conversion layer located on the hole extraction layer having a hole transporter and an electron transporter; and
a negative electrode located on the photoelectric conversion layer, wherein the positive electrode and the hole extraction layer are composed of the electrode body for a solar cell according to claim 5.

20. A dye-sensitized solar cell comprising:
a negative electrode having a semiconductor layer with a pigment as a photosensitizer;

an electrolyte layer located on the semiconductor layer of the negative electrode having paired oxidized species and reduced species; and a positive electrode located on the electrolyte layer having a conductive polymer layer that acts as a catalyst to convert the oxidized species into the reduced species, wherein the positive electrode is composed of the electrode body for a solar cell according to claim 5.

* * * * *